(12) United States Patent
Buchberger, Jr. et al.

(10) Patent No.: US 11,815,816 B2
(45) Date of Patent: Nov. 14, 2023

(54) APPARATUS FOR POST EXPOSURE BAKE OF PHOTORESIST

(71) Applicant: Applied Materials, Inc., Santa Clara, CA (US)

(72) Inventors: Douglas A Buchberger, Jr., Livermore, CA (US); Dmitry Lubomirsky, Cupertino, CA (US); John O. Dukovic, Palo Alto, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 454 days.

(21) Appl. No.: 17/176,108

(22) Filed: Feb. 15, 2021

(65) Prior Publication Data
US 2022/0260917 A1 Aug. 18, 2022

(51) Int. Cl.
*G03F 7/38* (2006.01)

(52) U.S. Cl.
CPC ................................. *G03F 7/38* (2013.01)

(58) Field of Classification Search
CPC ..... G03F 7/38; G03F 7/164; H01L 21/67103; H01L 21/67109; H01L 21/68728
See application file for complete search history.

(56) References Cited

U.S. PATENT DOCUMENTS

| 6,686,132 | B2 | 2/2004 | Cheng et al. |
| 6,841,342 | B2 | 1/2005 | Nishi et al. |
| 6,864,955 | B2 * | 3/2005 | Nishi ................... G03F 7/70991 355/76 |
| 7,341,939 | B2 | 3/2008 | Oweyang et al. |
| 7,402,782 | B2 | 7/2008 | Iwaki |
| 8,097,402 | B2 | 1/2012 | Scheer et al. |
| 8,097,492 | B2 | 1/2012 | Magerlein et al. |
| 8,288,174 | B1 | 10/2012 | Rathsack et al. |

(Continued)

FOREIGN PATENT DOCUMENTS

| CN | 100541330 C | 9/2009 |
| JP | 2005123651 A | 5/2005 |

(Continued)

OTHER PUBLICATIONS

Theodore Manouras et al., "High Sensitivity Resists for EUV Lithography: A Review of Material Design Strategies and Performance Results", Nanomaterials 2020.

(Continued)

*Primary Examiner* — Hung V Nguyen
(74) *Attorney, Agent, or Firm* — PATTERSON & SHERIDAN, LLP

(57) ABSTRACT

A method and apparatus for applying an electric field and/or a magnetic field to a photoresist layer without air gap intervention during photolithography processes is provided herein. The method and apparatus include an electrode assembly and a base assembly. The electrode assembly includes a permeable electrode. The base assembly includes one or more process fluid channels disposed around a circumference of the substrate support surface and configured to fill a process volume with a process fluid. The electrode assembly is configured to apply an electric field to a substrate disposed within the process volume.

20 Claims, 12 Drawing Sheets

(56) References Cited

U.S. PATENT DOCUMENTS

| | | |
|---|---|---|
| 8,343,371 B2 | 1/2013 | Funk et al. |
| 8,787,741 B2 * | 7/2014 | Kato .................. F27B 17/0025 392/416 |
| 9,482,953 B2 | 11/2016 | Koh et al. |
| 9,829,790 B2 | 11/2017 | Buchberger, Jr. et al. |
| 9,958,782 B2 | 5/2018 | Hanson et al. |
| 10,203,604 B2 | 2/2019 | Babayan et al. |
| 10,474,033 B2 | 11/2019 | Babayan et al. |
| 10,656,526 B2 | 5/2020 | Sano et al. |
| 10,795,262 B2 | 10/2020 | Park et al. |
| 2002/0123011 A1 | 9/2002 | Kawano et al. |
| 2007/0105043 A1 | 5/2007 | Elian et al. |
| 2010/0081285 A1 | 4/2010 | Chen et al. |
| 2011/0177694 A1 | 7/2011 | Chen et al. |
| 2015/0170952 A1 * | 6/2015 | Subramani ........ H01J 37/32091 361/234 |
| 2015/0355549 A1 | 12/2015 | Xie et al. |
| 2016/0011526 A1 | 1/2016 | Xie et al. |
| 2016/0357107 A1 | 12/2016 | Buchberger, Jr. et al. |
| 2018/0308669 A1 | 10/2018 | Bokka et al. |
| 2019/0006216 A1 | 1/2019 | Lau et al. |
| 2019/0187563 A1 | 6/2019 | Babayan et al. |
| 2019/0287792 A1 | 9/2019 | Park et al. |
| 2019/0369499 A1 | 12/2019 | Lai et al. |
| 2020/0201196 A1 | 6/2020 | Ronde et al. |
| 2020/0387074 A1 | 12/2020 | Hanson et al. |

FOREIGN PATENT DOCUMENTS

| | | |
|---|---|---|
| JP | 2006030506 A | 2/2006 |
| JP | 4251830 B2 | 4/2009 |
| KR | 10-2003-0053328 A | 6/2003 |
| WO | 2007045498 A2 | 4/2007 |
| WO | 2009101869 A1 | 8/2009 |
| WO | 2021/011166 A1 | 1/2021 |

OTHER PUBLICATIONS

International Search Report and Written Opinion dated Mar. 10, 2022 for Application No. PCT/US2021/059552.

International Search Report and Written Opinion dated May 18, 2022 for Application No. PCT/US2022/015146.

* cited by examiner

APPARATUS FOR POST EXPOSURE BAKE OF PHOTORESIST

BACKGROUND

Field

The present disclosure generally relates to methods and apparatus for processing a substrate, and more specifically to methods and apparatus for improving photolithography processes.

Description of the Related Art

Integrated circuits have evolved into complex devices that can include millions of components (e.g., transistors, capacitors and resistors) on a single chip. Photolithography is a process that may be used to form components on a chip. Generally the process of photolithography involves a few basic stages. Initially, a photoresist layer is formed on a substrate. A chemically amplified photoresist may include a resist resin and a photoacid generator. The photoacid generator, upon exposure to electromagnetic radiation in the subsequent exposure stage, alters the solubility of the photoresist in the development process. The electromagnetic radiation may have any suitable wavelength, for example, a 193 nm ArF laser, an electron beam, an ion beam, or other suitable source.

In an exposure stage, a photomask or reticle may be used to selectively expose certain regions of the substrate to electromagnetic radiation. Other exposure methods may be maskless exposure methods. Exposure to light may decompose the photo acid generator, which generates acid and results in a latent acid image in the resist resin. After exposure, the substrate may be heated in a post-exposure bake process. During the post-exposure bake process, the acid generated by the photoacid generator reacts with the resist resin, changing the solubility of the resist during the subsequent development process.

After the post-exposure bake, the substrate, particularly the photoresist layer, is developed and rinsed. Depending on the type of photoresist used, regions of the substrate that were exposed to electromagnetic radiation are either resistant to removal or more prone to removal. After development and rinsing, the pattern of the mask is transferred to the substrate using a wet or dry etch process.

The evolution of chip design continually requires faster circuitry and greater circuit density. The demands for greater circuit density necessitate a reduction in the dimensions of the integrated circuit components. As the dimensions of the integrated circuit components are reduced, more elements are required to be placed in a given area on a semiconductor integrated circuit. Accordingly, the lithography process must transfer even smaller features onto a substrate, and lithography must do so precisely, accurately, and without damage. In order to precisely and accurately transfer features onto a substrate, high resolution lithography may use a light source that provides radiation at small wavelengths. Small wavelengths help to reduce the minimum printable size on a substrate or wafer. However, small wavelength lithography suffers from problems, such as low throughput, increased line edge roughness, and/or decreased resist sensitivity.

An electrode assembly may be utilized to generate an electric field to a photoresist layer disposed on the substrate prior to or after an exposure process so as to modify chemical properties of a portion of the photoresist layer where the electromagnetic radiation is transmitted for improving lithography exposure/development resolution. However, the challenges in implementing such systems have not yet been adequately overcome.

Therefore, there is a need for improved methods and apparatus for improving immersion field guided post exposure bake processes.

SUMMARY

The present disclosure generally relates to substrate process apparatus. Specifically, embodiments of the disclosure relate to a substrate process apparatus including a base assembly and an electrode assembly. The base assembly includes a pedestal, a substrate support with a substrate support surface, a reservoir forming a reservoir volume, a piston assembly at least partially disposed within the reservoir volume, and a fluid passage disposed between a process volume and the reservoir. The electrode assembly includes a permeable electrode and a hood disposed around a portion of the permeable electrode.

In another embodiment, a substrate processing apparatus includes a base assembly, an electrode assembly, two or more linear actuators, and a rotation actuator. The base assembly includes a pedestal, a substrate support with a substrate support surface disposed thereon, a reservoir forming a reservoir volume, and a fluid passage disposed between a process volume and the reservoir. The electrode assembly includes an electrode and an electrode housing coupled to the electrode. The two or more linear actuators couple the base assembly and the electrode assembly and are configured to move the base assembly and the electrode assembly between an open and a closed position. The rotation actuator is coupled to one of the base assembly or the electrode assembly and configured to rotate the base assembly and the electrode assembly about an axis.

In yet another embodiment, a substrate process apparatus includes a base assembly, an electrode assembly, two or more linear actuators, and a rotation actuator. The base assembly includes a pedestal, a substrate support surface of the pedestal, and one or more fluid passages disposed through the base assembly. The electrode assembly includes an electrode and an electrode housing coupled to the electrode. The two or more linear actuators couple the base assembly and the electrode assembly and are configured to move the base assembly and the electrode assembly between an open and a closed position. The rotation actuator is coupled to one of the base assembly or the electrode assembly and configured to rotate the base assembly and the electrode assembly about an axis.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
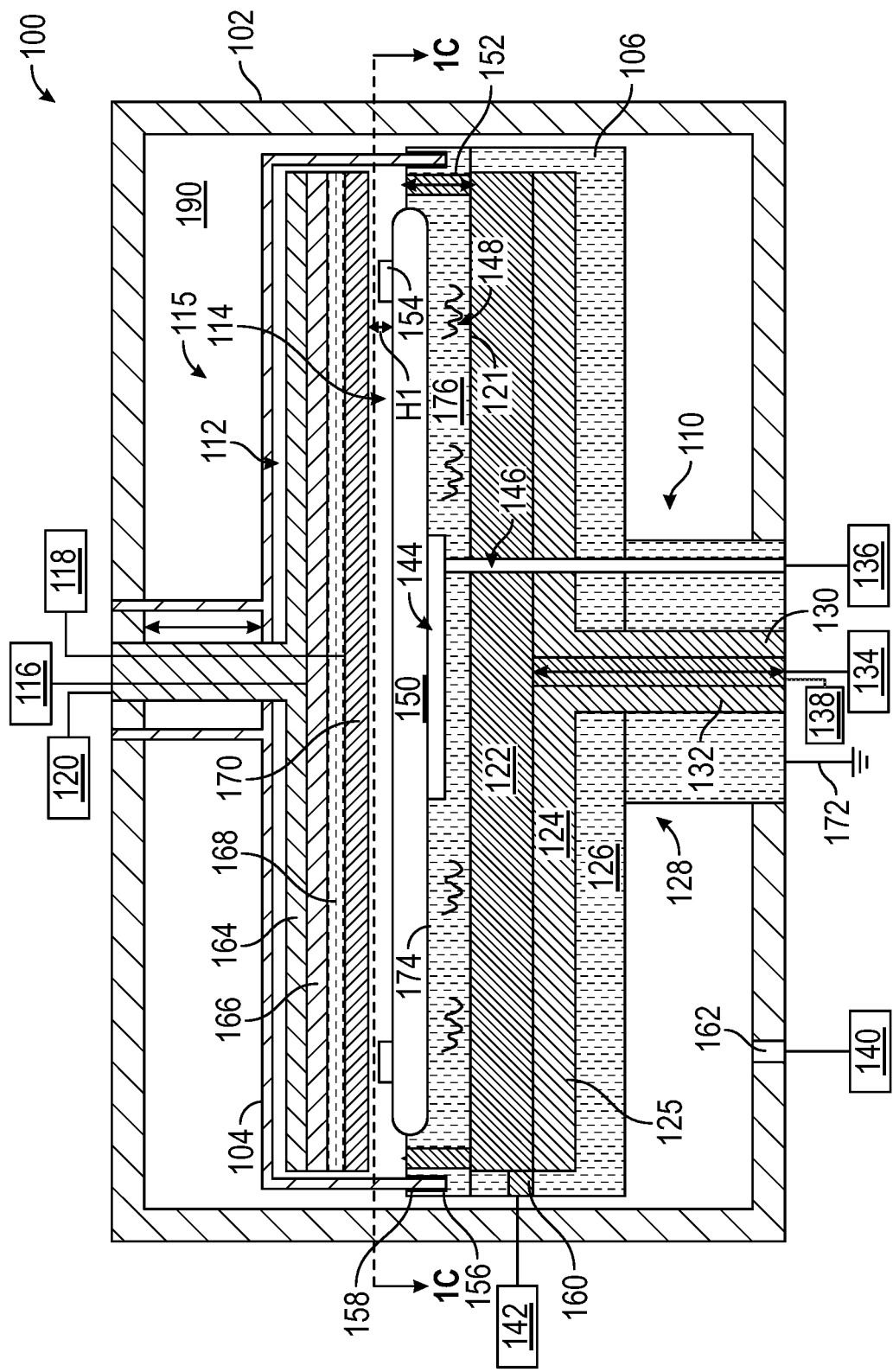
FIGS. 1A and 1B are schematic cross-sectional views of an immersion field guided post exposure bake chamber according to one embodiment described herein.

The present disclosure generally relates to methods and apparatus for post exposure bake processes. Methods and apparatus disclosed herein assist in reducing line edge/width roughness and improving exposure resolution in a photolithography process for semiconductor application.

The methods and apparatus disclosed herein improve the photoresist sensitivity and productivity of photolithography processes. The random diffusion of charged species generated by a photoacid generator during a post exposure bake procedure contributes to line edge/width roughness and reduced resist sensitivity. An electrode assembly, such as those described herein, is utilized to apply an electric field and/or a magnetic field to the photoresist layer during photolithography processes. The field application controls the diffusion of the charged species generated by the photoacid generator. Furthermore, an intermediate medium is utilized between the photoresist layer and the electrode assembly so as to enhance the electric field generated therebetween.

A gap defined between the photoresist layer and the electrode assembly results in voltage drop applied to the electrode assembly. If the gap between the photoresist layer and the electrode assembly is filled with air, then the voltage drop across the gap is high and results in lower strength electric field effects on the photoresist layer of a substrate. Using an intermediate medium with lower resistivity than air lowers the voltage drop across the gap and increases the voltage drop across the photoresist and increases the electric field strength on the photoresists layer. The higher strength electric field increases the effects of photochemistry within the photoresist layer during processing. Inaccurate levels of the electric field at the photoresist layer may result in insufficient or inaccurate voltage power to drive or create charged species in the photoresist layer in certain desired directions, thus leading to diminished line edge profile control to the photoresist layer. Thus, an intermediate medium is placed between the photoresist layer and the electrode assembly to prevent an air gap from being created therebetween so as to maintain the level of the electric field interacting with the photoresist layer at a certain desired level. By doing so, the charged species generated by the electric field are guided in a desired direction along the line and spacing direction, substantially preventing the line edge/width roughness that results from inaccurate and random diffusion. Thus, a controlled or desired level of electric field as generated increases the accuracy and sensitivity of the photoresist layer to expose and/or development processes. In one example, the intermediate medium is a non-gas phase medium, such as a slurry, gel, liquid solution, or a solid state medium that may efficiently maintain voltage levels as applied at a determined range when transmitting from the electrode assembly to the photoresist layer disposed on the substrate.

Even while using the intermediate medium, a voltage drop is still present between the photoresist layer and the electrode assembly. This voltage drop is directly related to the distance between the photoresist layer and the electrode assembly. Therefore, reducing the distance between the photoresist layer and the electrode assembly assists in improving the uniformity of the electric field between the photoresist layer and the electrode assembly. Another consideration while using the intermediate medium is bubbling between the photoresist layer and the electrode assembly. Bubbling and the formation of air pockets between the photoresist layer and the electrode assembly causes non-uniformities within the electric field and therefore increases the number of defects and inaccuracies within the photoresist after the post-exposure bake process. The present apparatus and methods described herein for reducing the distance between the photoresist and the electrode assembly beneficially reduces the number of bubbles or air pockets between the photoresist layer and the electrode assembly.

Embodiments provided herein additionally enable the horizontal loading of substrates into the post-exposure bake apparatus. The horizontal loading of the substrate into the post-exposure bake apparatus allows for easier integration of the module with existing transfer modules and apparatus, but has been found to increase the quantity of bubbles and negatively impact the uniformity of processing. Therefore, embodiments described herein are configured to overcome these challenges.

Figure 1B:
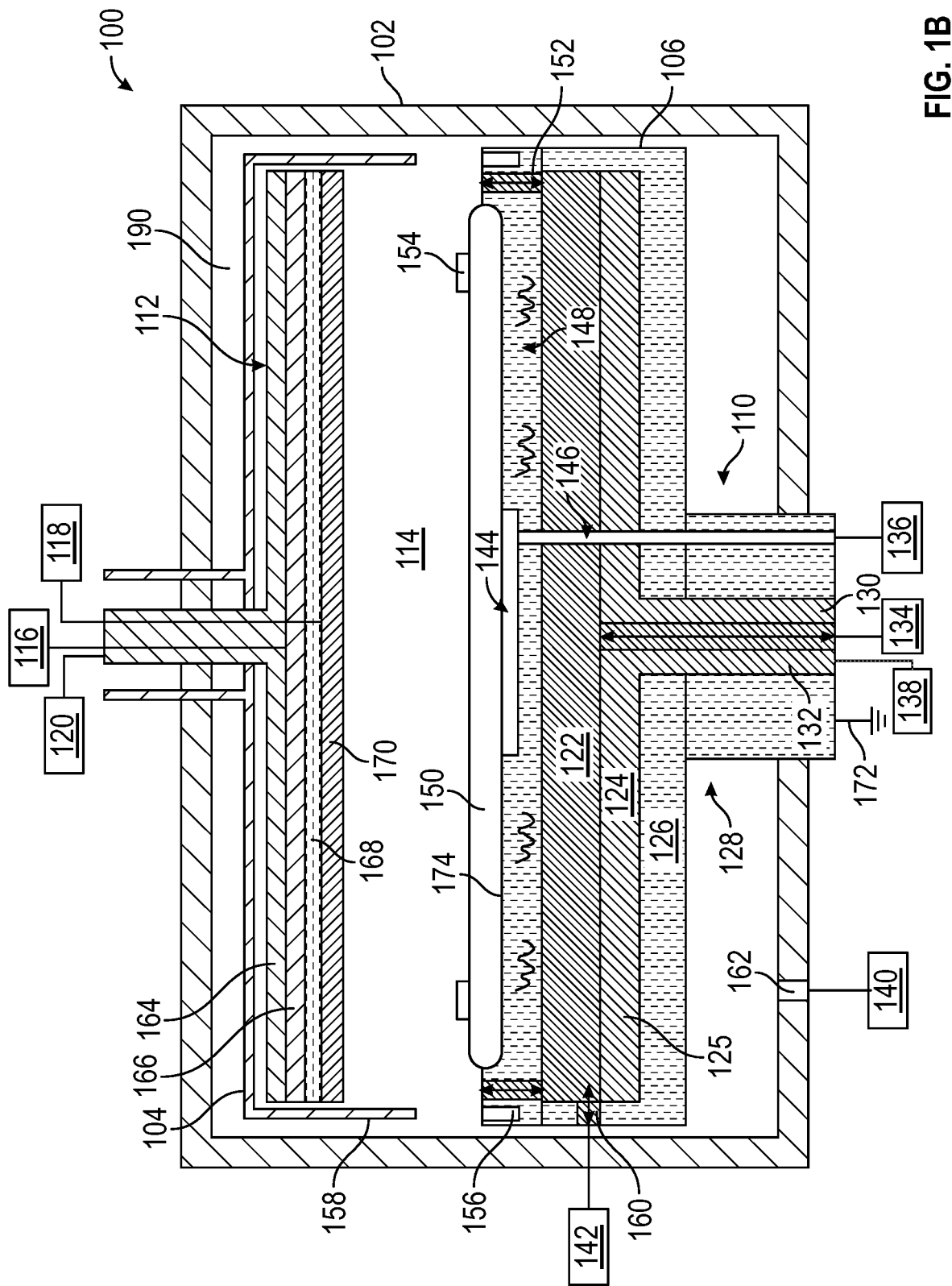

FIGS. 1A and 1B are schematic cross-sectional views of an immersion field guided post exposure bake chamber 100 according to one embodiment described herein. The immersion field guided post exposure bake chamber 100 includes a substrate process apparatus and a module body 102. The substrate process apparatus includes a base assembly 110 and an electrode assembly 115. The module body 102 surround the substrate process apparatus and forms a module volume 190. The base assembly 110 and the electrode assembly 115 are disposed within the module volume 190. The base assembly 110 is configured to receive a substrate, such as the substrate 150. The electrode assembly 115 is disposed opposite the base assembly 110 and is configured to apply an electric field to the substrate 150 and process the substrate 150 disposed thereon. The volume between the electrode assembly 115 and the substrate 150 is a process volume 114 and the process volume is filled with a process liquid during processing, such as the intermediate medium discussed herein.

The base assembly 110 includes a pedestal 106 with a substrate support 176 having a substrate support surface 174. The substrate support surface 174 forms an upper surface of the pedestal 106. The base assembly 110 further includes a reservoir 121 forming a reservoir volume 122, a piston assembly 124 at least partially disposed within the reservoir volume 122, and a fluid dispense passage 152 disposed between the process volume 114 and the reservoir 121. The pedestal 106 includes a support portion 126 and a shaft 128. The support portion 126 includes the reservoir 121 and the reservoir volume 122 disposed therein.

The support portion 126 further includes the substrate support surface 174 disposed in the top surface thereof. The substrate support surface 174 is sized to receive a substrate, such as the substrate 150. The substrate support surface 174 is a planar surface and is a divot within the top of the support portion 126. One or more sealing grooves 156 are disposed around the substrate support surface 174. The one or more sealing grooves 156 are grooves formed to receive a sealing portion 158 of a hood 104 of the electrode assembly 115. The one or more sealing grooves 156 may be a single groove which circumscribes the substrate support surface 174 and forms a ring.

An indexer depression 144 is disposed within the substrate support surface 174. The indexer depression 144 is configured to allow a robot arm to deposit the substrate 150 on top of the substrate support surface 174. The indexer depression 144 is a depression formed inward of the support portion 126 from the substrate support surface 174. A gas conduit 146 couples the indexer depression 144 and a gas pump 136. The gas pump 136 may either supply backside gas to the indexer depression 144 or provide a vacuum to the back surface of the substrate 150, which assists in holding the substrate 150 in place during processing. In some embodiments, an indexer depression 144 is not utilized, but the gas conduit 146 and the gas pump 136 are utilized to provide either backside gas or a vacuum force to the substrate support surface 174.

The shaft 128 is coupled to the bottom surface of the support portion 126. The shaft 128 may extend from the module volume 190 through an opening within the module body 102. The shaft 128 enables the pedestal 106 to be oscillated between an open and a closed position. FIG. 1A illustrates the pedestal 106 in a closed position and FIG. 1B illustrates the pedestal 106 in an open position.

The pedestal 106 is attached to ground 172 and grounded. Grounding the pedestal 106 enables better control of the electric field between the electrode assembly 115 and the substrate 150. Ground 172 is attached to the shaft 128 of the pedestal 106. The pedestal 106 is a conductive material, with an electrical resistivity of less than about $1\times10^{-3}$ Ω·m, such as less than $1\times10^{-4}$ Ω·m, such as less than $1\times10^{-5}$ Ω·m. The contact resistance between the pedestal 106 and the substrate 150 has a greater impact on the ability of the pedestal 106 to electrically ground the substrate 150 than the resistivity of the pedestal 106 itself. In embodiments described herein, the contact resistance between the pedestal 106 and the substrate 150 is less than about $1\times10^{-3}$Ω, such as less than about $1\times10^{-3}$Ω. In some embodiments, the pedestal 106 is an aluminum, a silicon carbide, a doped silicon carbide, or a dopes silicon material.

One or more heating elements 148 are disposed in the substrate support 176 between the reservoir volume 122 and the substrate support surface 174. The one or more heating elements 148 may be resistive heating elements or channels for flowing a heat transfer fluid. The heating elements 148 are disposed adjacent to the substrate support surface 174 to reduce the thermal mass between the resistive heating elements and the substrate 150. This increases the speed at which the resistive heating elements heat the substrate 150 during processing.

A fluid exhaust passage 160 fluidly couples the reservoir volume 122 and a first fluid pump 142. The first fluid pump 142 is configured to supply and/or removal the process fluid from the reservoir 121. In some embodiments, the first fluid pump 142 may both remove and supply process fluid to the reservoir 121. The fluid exhaust passage 160 and the first fluid pump 142 may additionally assist in reducing the pressure difference between each side of the piston assembly 124 as the piston assembly 124 actuates. The fluid exhaust passage 160 enables fluid to be pumped to either side of the piston assembly 124 depending upon the position of the piston assembly 124. Therefore, if a vacuum is formed below the piston assembly 124, fluid may be pumped in behind the piston assembly 124 to reduce the pressure differential and alleviate strain on a piston actuator 138, which is configured to move the piston assembly 124 upwards and downwards within the reservoir 121.

The piston assembly 124 is disposed within a portion of the reservoir volume 122. The piston assembly 124 includes a piston 125 and a piston shaft 130. The piston 125 has a cross section similar in shape and size to the reservoir 121, such that the piston assembly 124 actuates fluid between the reservoir volume 122 and the process volume 114 when the piston 125 is actuated between an upper surface of the reservoir 121 and a lower surface of the reservoir 121.

The piston shaft 130 is disposed through the shaft 128 of the pedestal 106. The piston shaft 130 further includes a piston fluid passage 132 disposed therethrough. The piston fluid passage 132 is connected to a second fluid pump 134 and connects the second fluid pump 134 and the reservoir volume 122 by passing through the piston shaft 130 and the piston 125. The piston fluid passage 132 enables constant fluid communication with the reservoir volume 122 above the piston 125 and the second fluid pump 134. The piston fluid passage 132 is used to supply fluid to the reservoir volume 122 and/or remove fluid from the reservoir volume 122. In some embodiments, the piston fluid passage 132 is used to both supply and remove fluid from the reservoir volume 122 between substrates as the process fluid is exchanged.

One or more clamps 154 are disposed around the substrate support surface 174. Once the substrate 150 has been placed on the substrate support surface 174 by a robot, the one or more clamps 154 are actuated to a clamping position to secure the substrate 150 to the substrate support surface 174. In one example, the one or more clamps 154 include three clamps disposed evenly around the outer edge of the substrate support surface 174, such that each of the clamps 154 is disposed at an angle of about 120 degrees from one another. Each of the clamps 154 is disposed within a corresponding divots 307. Each divot 307 is a small recess formed within the top surface of the pedestal 106. In some embodiments, there may be more or less clamps 154 to secure the substrate 150 inside of the substrate support surface 174. In some embodiments there may be only a single clamp 154, two clamps 154, or four or more clamps 154. The number of clamps 154 utilized depends upon the size of the substrate 150 and the type of clamp utilized. In some embodiments, the clamp 154 is a mechanically actuated clamp which oscillates between an open position and a closed position, wherein the clamp 154 is not in contact with the substrate 150 while in the open position and is in contact with the top surface of the substrate 150 while in the closed position. In other embodiments, the clamp 154 is a pneumatic or bladder assembly disposed around the substrate 150. The pneumatic assembly or bladder assemblies may be an inflatable ring or a plurality of inflatable sacks around the substrate 150. When actuated to a closed position, the pneumatic assembly or bladder assemblies are inflated using a gas, which applies pressure to the edges of the substrate 150. The clamps 154 assist in preventing fluid from flowing underneath the substrate while process fluid is in the process volume 114. In some embodiments, the clamps 154 are a vacuum clamp or an electrostatic clamp, such that a vacuum is applied to the back of the substrate or the substrate is chucked using an electric field.

The electrode assembly 115 includes an electrode 170 and a hood 104 disposed around at least a portion of the electrode 170. The electrode 170 is a conductive mesh or a finely perforated electrode plate. The electrode 170 is permeable to allow fluid to pass therethrough, for example through perforations, mesh, pores, or other fluid permeable structures. The electrode 170 is utilized in order to reduce the amount of bubbles or gas pockets which are trapped under the electrode assembly 115 as the electrode assembly 115 is submerged into the process fluid. The electrode 170 in some embodiments, is a non-metal mesh, such as a silicon carbide mesh, such as a doped silicon carbide. In other embodiments, the electrode 170 is a conductive metal mesh, such as a copper, aluminum, platinum, or a steel mesh. The electrode 170 is electrically coupled to a first power source 118. The first power source 118 is configured to apply power to the electrode 170. In some embodiments, an electrical potential of up to 5000 V is applied to the electrode 170 by the first power source 118, such as less than 4000 V, such as less than 3000 V.

The hood 104 is electrically insulating. For example, the hood 104 is made from an electrically insulating material that reduces the flow of electric fields therethrough. The hood 104 being fabricated from an insulating material is beneficial in that hood 104 shields the substrate 150 from electric fields present outside of the hood 104 so that the electric field applied to the substrate 150 is more easily controlled. The hood 104 is shaped to surround an upper surface and the side surfaces of the electrode 170. The hood 104 also at least partially encloses a monitor electrode 166, a spacer 168, and an electrode holder 164. In some embodiments the hood 104 is an electrically conductive material with an electric resistivity of less than about $1 \times 10^{-3}$ Ω·m, such as less than $1 \times 10^{-4}$ Ω·m, such as less than $1 \times 10^{-5}$ Ω·m. In some embodiments, a metal, a metal alloy, or a silicon carbide material hood 104 is utilized. The hood 104 is electrically isolated from the electrode 170, the monitor electrode 166, and the spacer 168.

The monitor electrode 166 and the spacer 168 are oriented parallel to the electrode 170. The monitor electrode 166 is disposed parallel to the electrode 170. The monitor electrode 166 may have a similar size and shape as the electrode 170. The monitor electrode 166 is fabricated from a material different than that of the electrode 170. The monitor electrode 166 is electrically coupled to a second power source 116. The second power source 116 is similar to the first power source 118 and is configured to apply power to the monitor electrode 166. In some embodiments, an electrical potential of up to 5000 V is applied by the second power source 116 to the monitor electrode by the second power source 116, such as less than 4000 V, such as less than 3000 V. The monitor electrode 166 is spaced from the electrode 170 and enables a user or a controller to monitor the electric field of the electrode 170. Monitoring the electric field of the electrode 170 allows for discrepancies within the electric field to be analyzed during substrate processing. The discrepancies may be caused by either bubbling or the changing of process fluid characteristics throughout the process. The monitor electrode 166 provides a constant source of feedback which can be used to assess the electric field being applied to the substrate 150 through the process fluid. The monitor electrode 166 is still a perforated electrode or a conductive mesh. The monitor electrode 166 is configured to allow bubbles to pass therethrough.

The spacer 168 is disposed between the monitor electrode 166 and the electrode 170. The spacer 168 is an insulating material, such as a ceramic material. In embodiments described herein, the spacer 168 is a disk disposed between the electrode 170 and the monitor electrode 166 that reduces the influence of the monitor electrode 166 on the electric field produced by the electrode 170 during substrate processing. The spacer 168 is permeable in a similar manner as the monitor electrode 166 and/or the electrode 170. The spacer 168 includes a plurality of passages disposed therein to allow bubbles and process fluid to pass therethrough. The diameter of the spacer 168 is similar to or larger than the diameter of the electrode 170 and the monitor electrode 166. In some embodiments the spacer 168 is connected to a top surface of the electrode 170 and a bottom surface of the monitor electrode 166.

The electrode holder 164 is configured to hold each of the electrode 170, the monitor electrode 166, and the spacer 168 in place during substrate processing. The electrode holder 164 is disposed within the hood 104 and includes a coupling portion and a shaft. The electrode holder 164 is attached to the top surface of the monitor electrode 166. The electrode holder 164 may additionally include perforations therein to allow for bubbles to pass therethrough. The electrode holder 164 may be coupled to an electrode actuator 120. The electrode actuator 120 is configured to move the electrode assembly 115 upwards and downwards between a processing position, as shown in FIG. 1A, and a substrate receiving position, as shown in FIG. 1B. The electrode holder 164 is further coupled to the hood 104. Gas which bubbles up through the electrode 170, the spacer 168, the monitor electrode 166, and the electrode holder 164 enters an intermediate volume 112 between the electrode holder 164 and the hood 104. The bubbles may be removed from the intermediate volume 112 by a vacuum pump or left within the intermediate volume 112 is the bubbles do not influence the electric field of the electrode 170.

Figure 1C:
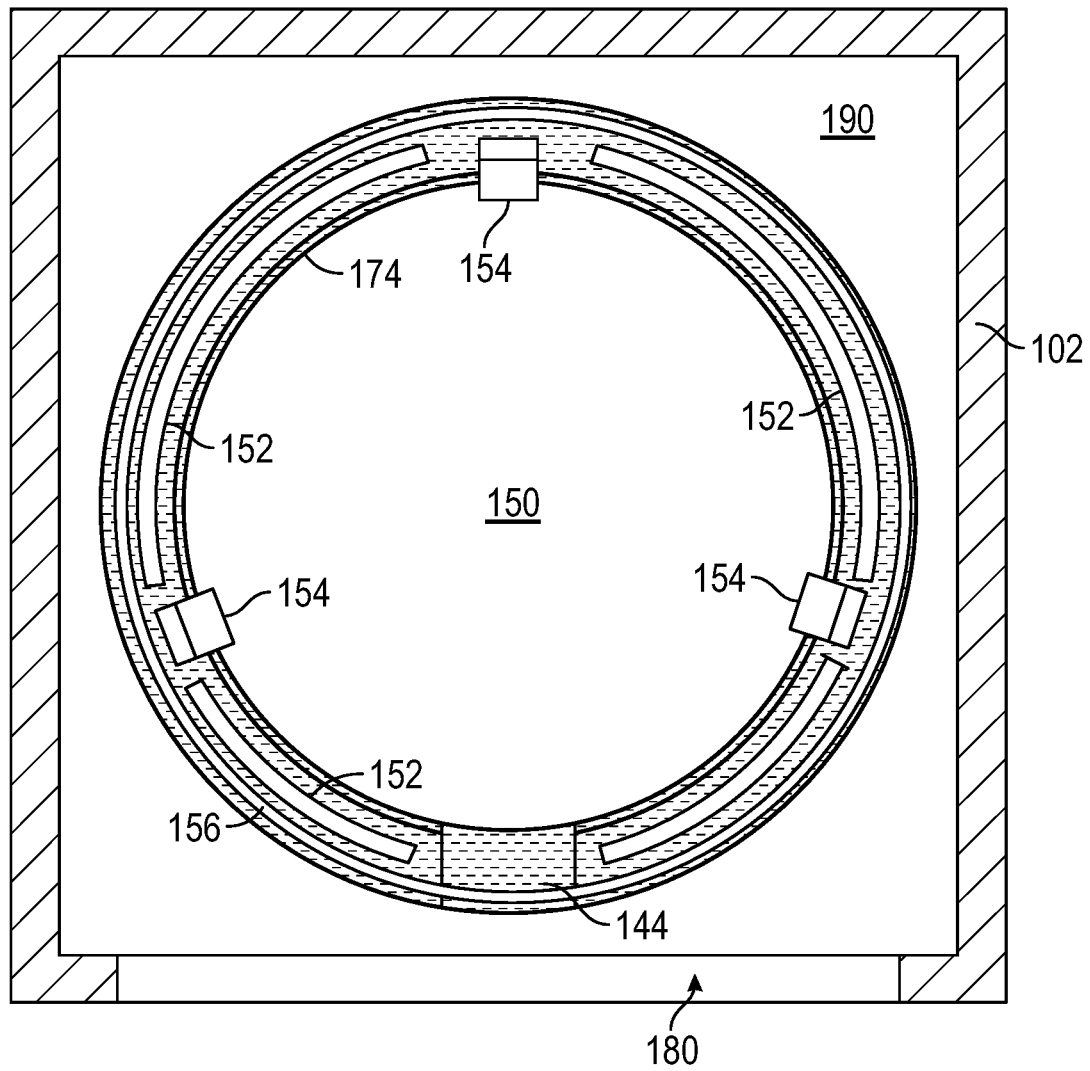
FIG. 1C is a cross-sectional plan view of the immersion field guided post exposure bake chamber according to the embodiment of FIGS. 1A and 1B described herein.

The module body 102 includes a fluid removal passage 162 disposed therethrough. The fluid removal passage 162 is coupled to a removal pump 140 and the module volume 190. The fluid removal passage 162 is disposed through a bottom surface of the module body 102 to enable removal of excess fluid, which escapes from the process volume 114 and spills into the module volume 190, before being removed from the module volume 190 by the removal pump 140. As shown in FIG. 1C, the module body 102 further includes a substrate transfer passage 180 disposed through a sidewall of the module body 102. The substrate transfer passage 180 is sized to allow a substrate and a robot arm (not shown) to pass therethrough. The substrate transfer passage 180 allows for transfer of the substrate into the module volume 190 in a horizontal orientation.

As discussed herein, FIG. 1A illustrates the electrode assembly 115 and the base assembly 110 while in a processing position. While in the processing position, the sealing portions 158 of the hood 104 are inserted into the one or more sealing grooves 156 of the electrode assembly base assembly 110. A seal is formed between the electrode assembly 115 and the base assembly 110 to seal the process volume 114 from the module volume 190 or other outside volumes. The seal allows for the process fluid disposed within the reservoir volume 122 to fill the process volume 114. The process fluid within the reservoir volume 122 fills the process volume 114 as the piston assembly 124 is actuated upwards. The process fluid flows through the fluid dispense passages 152 disposed around the substrate 150 and the substrate support surface 174. Moving the piston assembly 124 in an opposite direction may remove the process fluid from the process volume 114 and return the process fluid to the reservoir volume 122. The distance between the top surface of the substrate 150 and the bottom surface of the electrode 170 is a first height $H_1$. The first height $H_1$ is less than about 7 mm, such as less than about 5 mm, such as less than about 4 mm, such as about 1 mm to about 4 mm. The first height $H_1$ is smaller to improve the uniformity of the electric field applied to the substrate 150. Apparatus described herein enable smaller distances between the electrode and the substrate as the location and size of the fluid dispense passages 152 does not limit the distance between the two surfaces.

FIG. 1B illustrates the electrode assembly 115 and the base assembly 110 while in a transfer position. While in the transfer position, the hood 104 is space apart from the base assembly 110 such that the sealing portions 158 of the hood 104 are disposed outside of the sealing grooves 156 of the base assembly 110. The transfer position allows for a substrate to be inserted and removed from the process volume 114 between the hood 104 and the base assembly 110 by an indexer or a robot arm. The electrode assembly 115 may be raised by the electrode actuator 120, the base assembly 110 may be lowered by a base actuator (not shown), or a combination of movement of the electrode assembly 115 and the base assembly 110 may be performed. When the electrode assembly 115 and the base assembly 110 are in the transfer position, process fluid does not fill the process volume 114. In some embodiments, opening the process volume 114 by actuating the electrode assembly 115 and the base assembly 110 away from each other is considered a method of removal of used process fluid, such that the process fluid flows into the module volume 190 and is removed via the fluid removal passage 162.

FIG. 1C is a cross-sectional plan view of the immersion field guided post exposure bake chamber 100 according to the embodiment of FIGS. 1A and 1B described herein. The cross sectional view illustrates the location of the indexer depression 144, the substrate transfer passage 180, the one or more sealing grooves 156, the one or more clamps 154, and the fluid dispense passages 152.

As shown in FIG. 1C, the indexer depression 144 extends to the edge of the base assembly 110 and includes a portion of the one or more sealing grooves 156. In some embodiments, the one or more sealing grooves 156 is deeper than the indexer depression 144, such that the process volume 114 is sealed during substrate processing. The one or more sealing grooves 156 is shown herein as a single groove disposed around the base assembly 110. The one or more sealing grooves 156 is disposed outward of the substrate support surface 174, the one or more clamps 154, and the fluid dispense passages 152.

The one or more clamps 154 are disposed to radially overlap a portion of the substrate 150 and the substrate support surface 174. The clamps 154 are disposed evenly about the substrate support surface 174 and between at least some of the fluid dispense passages 152.

The fluid dispense passages 152 are shown as one or more arcuate openings disposed around the substrate support surface. The arcuate openings are used to reduce the velocity at which process fluid enters and leaves the process volume 114. The arcuate openings may include two or more arcuate openings, such as three or more arcuate openings, such as four or more arcuate openings. Each of the arcuate openings are arcs with a common center and the same arc radius. The arc radius is greater than the radius of the substrate support surface 174. Each of the arcs surround about 10 degrees to about 180 degrees of the circumference of the substrate support surface 174. Each of the arcs of the fluid dispense passages 152 are in fluid communication with the reservoir volume 122.

Figure 2A:
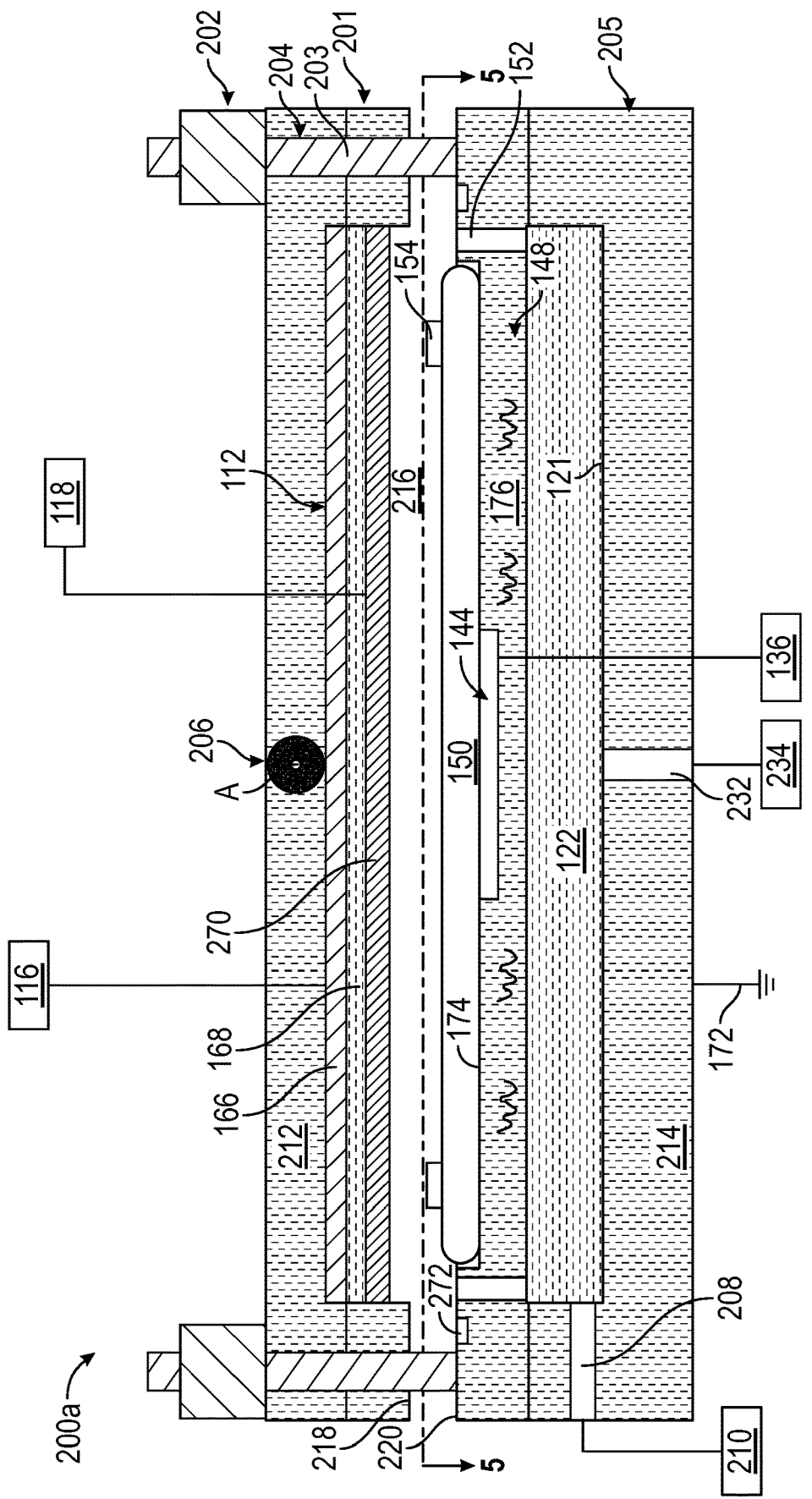
FIG. 2A is a schematic cross-sectional view of an immersion field guided post exposure bake chamber according to another embodiment described herein.

FIG. 2A is a schematic cross-sectional view of a substrate process apparatus 200a of an immersion field guided post exposure bake chamber according to another embodiment described herein. The substrate process apparatus 200a includes a base assembly 205 and an electrode assembly 201. Two or more linear actuators 204 couple the base assembly 205 and the electrode assembly 201 together and enable the separation and sealing of the base assembly 205 and the electrode assembly 201 to each other. A rotation actuator 206 is coupled to one of the base assembly 205 or the electrode assembly 201. As shown in FIG. 2A, the rotation actuator 206 is coupled to the electrode assembly 201.

The base assembly 205 includes a pedestal 214, a substrate support 176 disposed on an upper surface of the pedestal 214, a reservoir 121 forming a reservoir volume 122, and a fluid dispense passage 152 disposed between a process volume 216 and the reservoir 121. The substrate support 176 has a substrate support surface 174. At least the substrate support 176, the substrate support surface 174, the reservoir 121, and the fluid dispense passages 152 are similar to those discussed with reference to FIGS. 1A-1C. The reservoir 121 of the embodiment of FIG. 2A does not include a pedestal disposed within the reservoir volume 122. The substrate support surface 174, the reservoir 121, and the fluid dispense passages 152 are disposed within the pedestal 214. The pedestal 214 is a lower portion of the substrate process apparatus 200a and is configured to support a substrate, such as the substrate 150 during processing and to provide process fluid to a process volume 216.

The pedestal 214 is connected to ground 172. The pedestal 214 is grounded to enable grounding of the substrate 150 through the substrate support 176 when the substrate 150 is disposed on the substrate support surface 174 of the substrate support 176. One or more heating elements 148 are disposed in the base assembly 205 between the reservoir 121 and the substrate support surface 174. One or more clamps 154 are disposed on the top surface of the pedestal 214 and around the substrate support surface 174. The clamps 154 assist in preventing fluid from flowing underneath the substrate while process fluid is in the process volume 216. An indexer depression 144 is disposed within the substrate support surface 174 as described herein.

A seal groove 272 is disposed around the substrate support surface 174 and the fluid dispense passages 152. The seal groove 272 is an o-ring gland and is disposed in a base sealing surface 220. The base sealing surface 220 is a surface surrounding the substrate support surface 174 and the fluid dispense passages 152. The base sealing surface 220 is a planar surface and disposed parallel to a housing sealing surface 218 of the electrode assembly 201. The two or more linear actuators 204 are connected to the base sealing surface 220 and may be disposed through a portion of the base sealing surface 220.

The pedestal 214 includes a first fluid passage 232 connected to a first fluid pump 234. The first fluid passage 232 connects the first fluid pump 234 and the reservoir volume 122. The first fluid passage 232 and the first fluid pump 234 are similar to the piston fluid passage 132 and the second fluid pump 134 of FIGS. 1A-1B, but the first fluid passage 232 passes through the pedestal 214 rather than a piston.

The second fluid passage 208 and the second fluid pump 210 additionally assist in providing or removing process fluid from the reservoir volume 122. The second fluid passage 208 is disposed through a sidewall of the reservoir 121 and is fluidly coupled to the second fluid pump 210. The second fluid pump 210 is configured to supply and/or remove process fluid from the reservoir volume 122. In some embodiments, the second fluid pump 210 is configured to provide process fluid to the reservoir volume 122 through the second fluid passage 208 while the first fluid pump 234 is configured to remove process flow from the reservoir volume 122 through the first fluid passage 232. The flow rate of the process fluid from the second fluid pump 210 into the reservoir volume 122 determines the rate at which fluid enters the process volume 216. In the embodiment of FIG. 2A, the reservoir volume 122 assists in providing even distribution flow of process fluid through the fluid dispense passages 152 into the process volume 216 with reduced bubbling. The first fluid passage 232 being disposed through the bottom of the reservoir 121 allows for complete removal of the process fluid from the reservoir volume 122 between process operations while the pedestal 214 is in a horizontal position.

The electrode assembly 201 include an electrode 270, and an electrode housing 212 coupled to the electrode 270. The electrode 270 is similar to the electrode 170, but is not perforated or permeable in all embodiments. The ability of the substrate process apparatus 200a to rotate about the rotation actuator 206 reduces the amount of bubbles trapped under the electrode 270 and therefore, a perforated electrode or a conductive mesh may not be utilized in some embodiments. The electrode 270 in some embodiments, is a non-metal mesh, such as a silicon carbide mesh. In other embodiments, the electrode 270 is a conductive metal mesh, such as a copper, aluminum, platinum, or a steel mesh. The electrode 270 is electrically coupled to a first power source 118. The first power source 118 is configured to apply power to the electrode 270. In some embodiments, an electrical potential of up to 5000 V is applied to the electrode 270 by the first power source 118, such as less than 4000 V, such as less than 3000 V.

A monitor electrode 166 and a spacer 168 are disposed above the electrode 270. The monitor electrode 166 and the spacer 168 are described with reference to FIGS. 1A-1C. The monitor electrode 166 and the spacer 168 described with reference to FIGS. 2A-2C in some embodiments are not permeable. The monitor electrode 166 is coupled to the second power source 116 as described herein. In some embodiments, there is an intermediate volume 112 disposed between the monitor electrode 166 and the electrode housing 212.

The electrode housing 212 is configured to support the electrode 270, the monitor electrode 166, and the spacer 168. The electrode housing 212 disposed around at least a portion of the electrode 270, the monitor electrode 166, and the spacer 168, such that the electrode housing 212 are disposed above the entirety of the electrode 270, the monitor electrode 166, and the spacer 168 when the substrate process apparatus 200a is in a horizontal position. The electrode housing 212 further is disposed around at least a portion of the side surface of the electrode 270, the monitor electrode 166, and the spacer 168. The housing sealing surface 218 is disposed radially outward of and around the electrode 270, the monitor electrode 166, and the spacer 168. The housing sealing surface 218 forms a ring and is parallel to the base sealing surface 220. The housing sealing surface 218 is parallel to the bottom surface of the electrode 270 and offset from the bottom surface of the electrode 270, such that the housing sealing surface 218 is disposed in a plane closer to the base sealing surface 220 than a plane disposed through the bottom surface of the electrode 270.

Figure 2B:
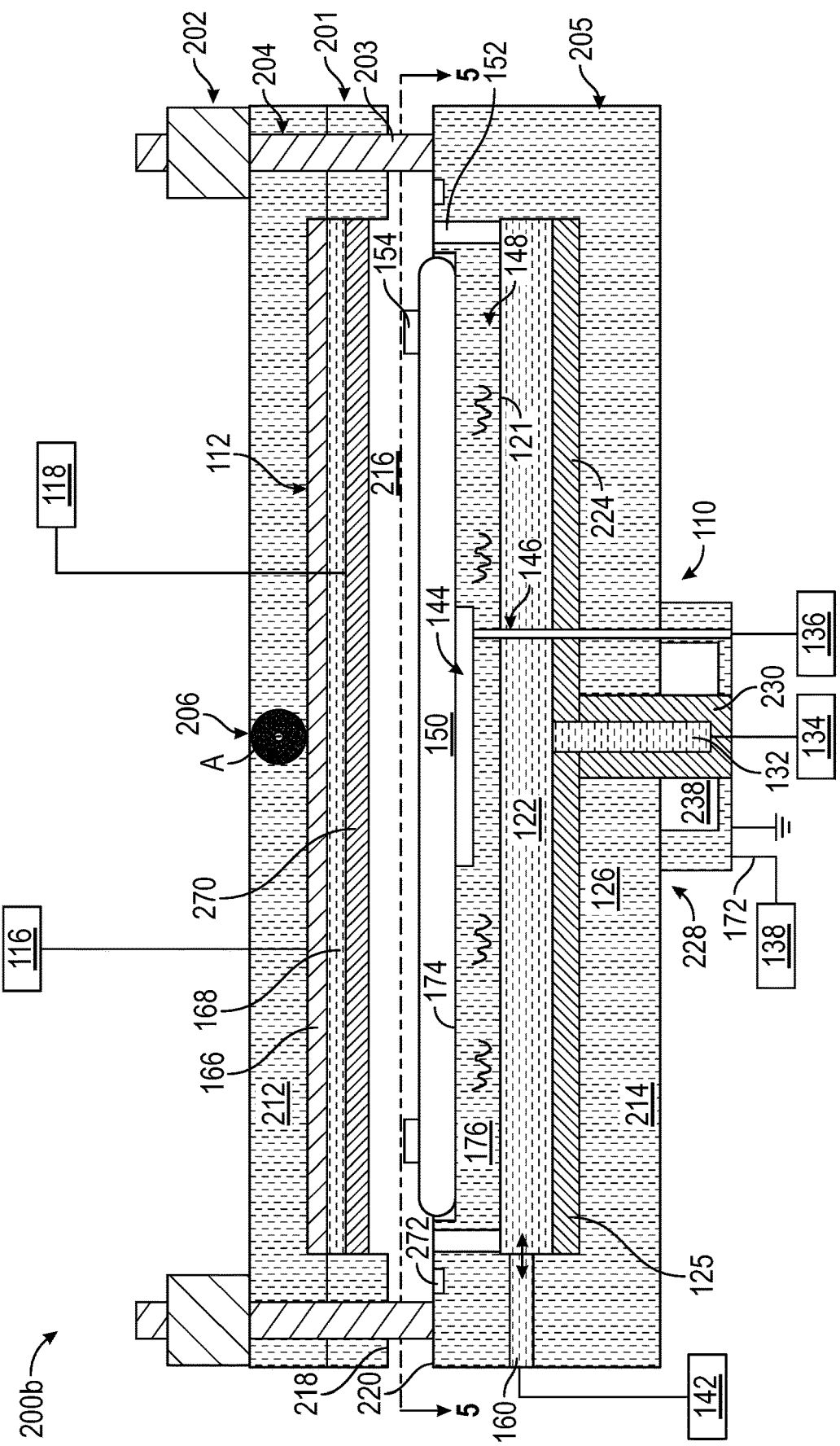
FIG. 2B is a schematic cross-sectional view of an immersion field guided post exposure bake chamber according to yet another embodiment described herein.

The linear actuators 204 are disposed through the electrode housing 212 radially outward from the electrode 270. As shown in FIGS. 2A-2C, there are two linear actuators 204 disposed opposite one another. The linear actuators 204 include a guide 203 and an actuator 202. The guide 203 is disposed through the electrode housing 212 and is connected and disposed within the base sealing surface 220. The guide 203 is connected to the base sealing surface 220 using a mechanical fastener or an adhesive. In some embodiments, a hole is formed within the base sealing surface 220 to receive the guide 203. The guides 203 pass through the electrode housing 212 and through the housing sealing surface 218. Each of the guides 203 is coupled to one of the actuators 202. Each actuator 202 is connected to the electrode housing 212 and may surround a portion of the guide 203. The actuator 202 is configured to couple to the guide 204 and moves one of the electrode housing 212 or the base assembly 205. The actuators 202 are pneumatic cylinders. Other types of actuators 202 may also be utilized, such as a hydraulic actuator or an electro-mechanical actuator. The actuators 202 actuate the guides 203 upward while remaining coupled to the electrode housing 212 to lift the base assembly 205 towards the electrode housing 212 and the electrode assembly 201.

Figure 4A:
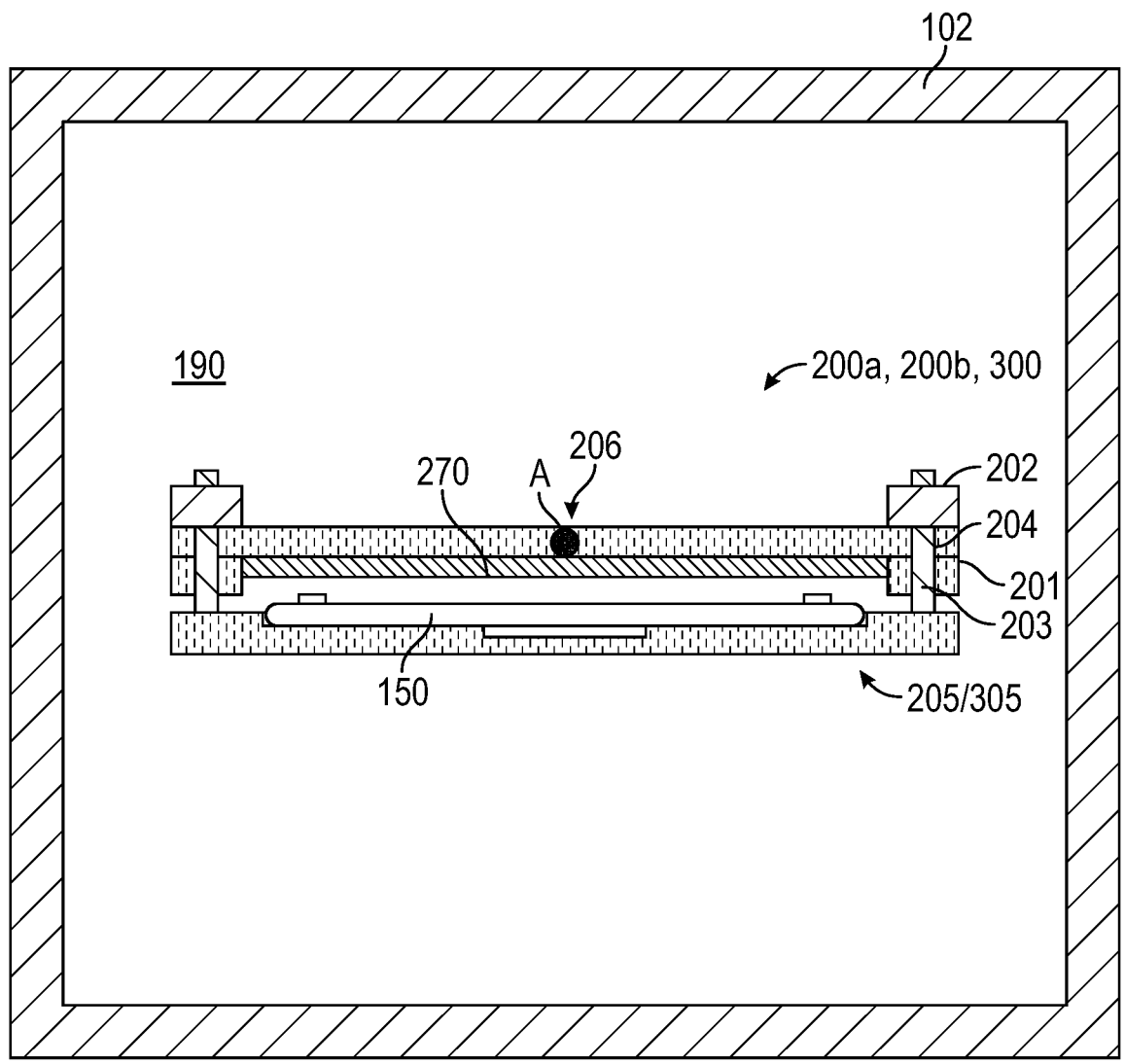
FIG. 4A-4C are schematic cross-sectional views of the immersion field guides post exposure bake chambers of FIGS. 2A, 2B, and 3 at different processing positions.
Figure 4B:
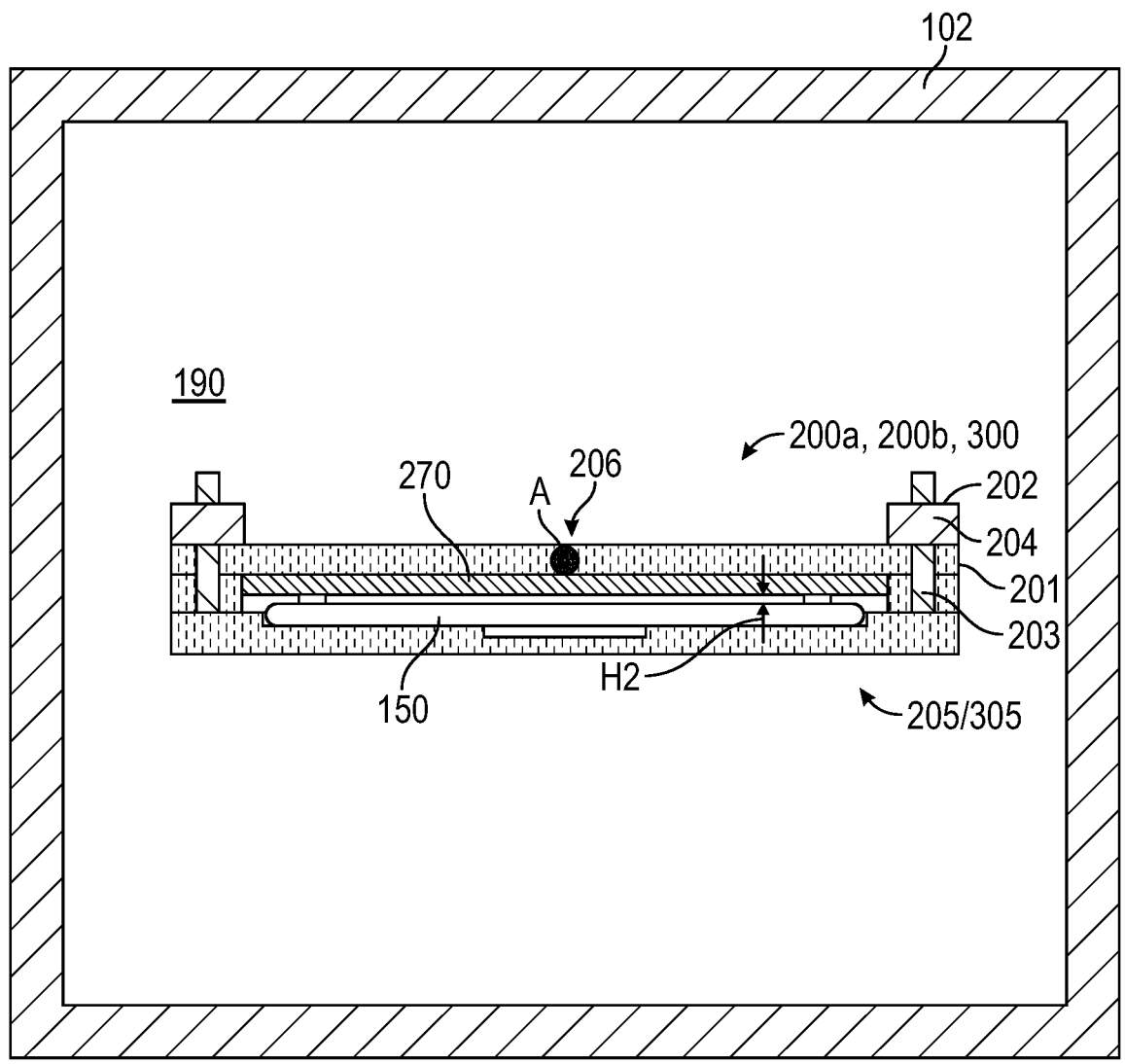
Figure 4C:
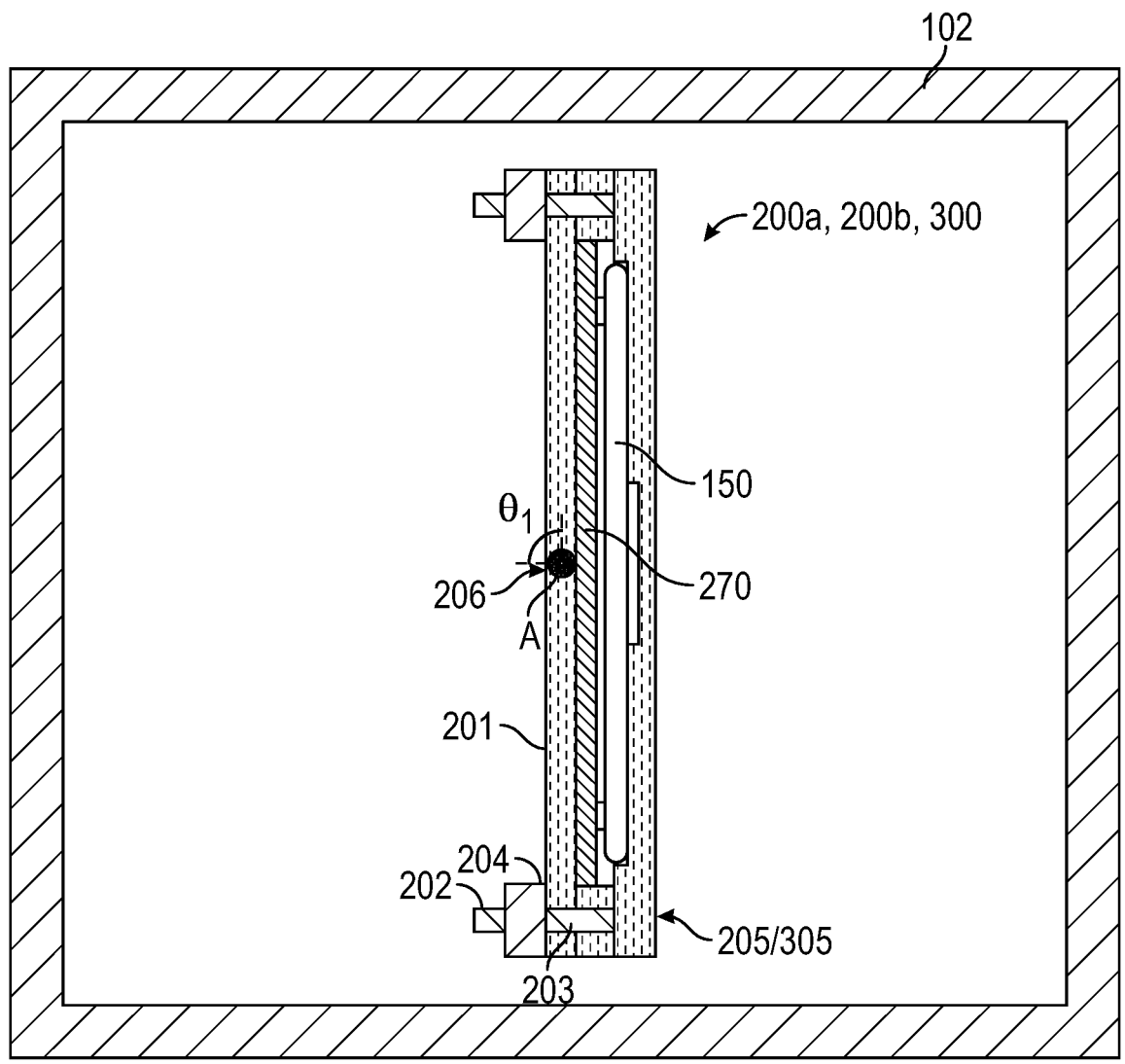

The rotation actuator 206 is coupled to the electrode housing 212. In some embodiments, the rotation actuator 206 is disposed through the electrode housing 202. The rotation actuator 206 includes a shaft connected to the electrode housing 202 (or in some embodiments, the base assembly 205). The rotation actuator 206 includes a rotation axis A disposed therethrough. The rotation axis A is the axis about which the substrate process apparatus 200a is rotated. The rotation actuator 206 includes a shaft and a rotary actuator for rotating the shaft. In some embodiments, the rotary actuator is coupled to the substrate process apparatus 200a and a shaft is disposed therethrough to couple the substrate process apparatus 200a to a module body 202 (FIG. 4A-4C). The rotation actuator 206 is centered along a diameter of the substrate support surface 174 and a diameter of an electrode 170 if the electrode 170 is a disk. Placing the rotation actuator 206 along the same plane as a diameter of the substrate support surface 174 and the electrode 170 reduces the moment used to hold the substrate process apparatus 200a in a horizontal position.

In other embodiments, the rotation actuator 206 may be disposed through other portions of the substrate process apparatus 200a, such as through the base assembly 205 or connected to the electrode housing 212 by an arm. The rotation actuator 206 is placed in a location which reduces the moment used to rotate the substrate process apparatus 200a, such that the rotation axis A of the rotation actuator 206 is close to a center of gravity of the substrate process apparatus 200a. The rotary actuator may be an electric, pneumatic, hydraulic or other device operable to impart rotation to the electrode assembly 201 and the base assembly 205 about the axis A.

FIG. 2B is a schematic cross-sectional view of another substrate process apparatus 200b of an immersion field guided post exposure bake chamber. The substrate process apparatus 200b is similar to the substrate process apparatus 200a of FIG. 2A, but includes a piston assembly 224. The piston assembly 224 is similar to the piston assembly 124 of FIGS. 1A-1C, but includes a restricted shaft 230 attached to the piston 125.

The restricted shaft 230 does not pass completely through the pedestal 214 and instead is only disposed through a portion of the pedestal 214. The restricted shaft 230 is coupled to a piston actuator 238. The piston actuator 238 is coupled to and contacting the restricted shaft 230. The piston actuator 238 is a linear actuator, such as a pneumatic cylinder for moving the piston assembly 224 within the reservoir volume 122. The restricted shaft 230 of the piston assembly 224 is disposed partially within a restricted base shaft 228. The restricted base shaft 228 is a short shaft disposed on and connected to the bottom of the pedestal 214, which holds the piston actuator 238 therein. The piston assembly 224 is beneficial in that it assists in even distribution of the process fluid into the process volume, but adds additional mechanical complexity and cost.

Figure 3:
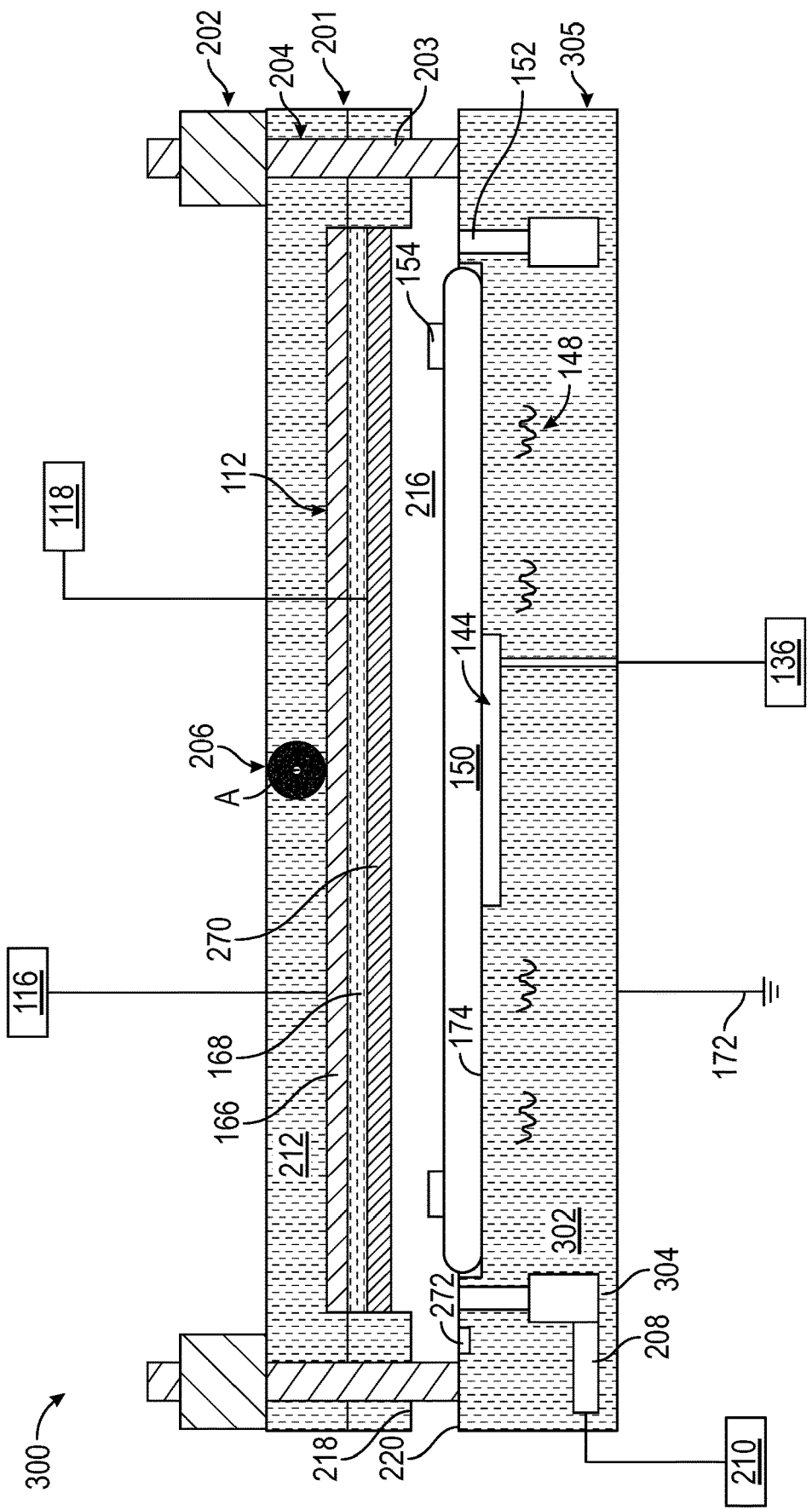
FIG. 3 is a schematic cross-sectional view of an immersion field guided post exposure bake chamber according to yet another embodiment described herein.

FIG. 3 is a schematic cross-sectional view of yet another substrate process apparatus 300 of an immersion field guided post exposure bake chamber according to yet another embodiment described herein. The substrate process apparatus 300 of FIG. 3 includes a similar electrode assembly 201 as the substrate process apparatus 200a of FIG. 2A and the substrate process apparatus 200b of FIG. 2B. The substrate process apparatus 300 of FIG. 3 is different from the embodiments of FIG. 2A and FIG. 2B in that the base assembly 305 of FIG. 3 does not include a reservoir 121 or a reservoir volume 122 (FIGS. 2A-2B).

The base assembly 305 includes a pedestal 302 with a fluid distribution conduit 304 coupling the fluid passage 208 and the fluid dispense passages 152. The clamps 154, the substrate support surface 174, the indexer depression 144, the base sealing surface 220, and the heating elements 148 are each similar to those described previously herein.

The fluid distribution conduit 304 is a ring disposed through the pedestal 302. The fluid distribution conduit 304 is connected to each of the fluid dispense passages 152 as well as the fluid passage 208. The fluid distribution conduit 304 is configured to circulate fluid from one or more fluid passages 208 around the circumference of the substrate support surface 174. The fluid distribution conduit 304 may have a larger inner and/or outer diameter than the diameter of the substrate support surface 174.

The size of the fluid distribution conduit 304 may vary as the fluid distribution conduit 304 extends through the pedestal 302, such that the fluid distribution conduit 304 has a larger cross section further from the intersection with the fluid passage 208 compared to the cross section of the fluid distribution conduit 304 closer to the intersection with the fluid passage 208. This is done to enable more even distribution of fluid through the fluid dispense passages 152.

FIG. 4A-4C are schematic cross-sectional views of the substrate process apparatus 200a, 200b, 300 of the immersion field guides post exposure bake chambers of FIGS. 2A, 2B, and 3 at different processing positions within a module body 102. As shown in FIG. 4A, the electrode assembly 201 and the base assembly 205, 305 are in a substrate transfer position, such that a substrate 150 may be transferred in and out of the substrate process apparatus 200a, 200b, 300. While in the transfer position, the electrode assembly 201 and the base assembly 205, 305 are separated and do not form a sealed process volume.

The substrate process apparatus 200a, 200b, 300 is held in a horizontal position by the rotation actuator 206 to enable the horizontal placement of the substrate 150 on the base assembly 205, 305. The linear actuators 204 are disposed in an open position, such that the guides 203 are extended by the actuator 202 and create separation between the electrode assembly 201 and the base assembly 205, 305.

FIG. 4B illustrates the substrate process apparatus 200a, 200b, 300 while in a closed position. Bringing the substrate process apparatus 200a, 200b, 300 to a closed position involves using the actuators 202 to actuate the guides 203 upwards and reduce the distance between sealing surfaces to zero. Bringing the base assembly 205, 305 upwards to meet the electrode assembly 201 or bringing the electrode assembly 201 downward to meet the base assembly 205, 305 forms a seal between the electrode assembly 201 and the base assembly 205, 305. The seal between the electrode assembly 201 and the base assembly 205, 305 forms a process volume, such as the process volume 216 of FIGS. 2A, 2B, and 3. While in the closed position, the distance between the top of the substrate 150 and the bottom of the electrode 270 is a second height $H_2$. The second height $H_2$ is less than about 7 mm, such as less than about 5 mm, such as less than about 4 mm, such as about 1 mm to about 4 mm. The second height $H_2$ is smaller to improve the uniformity of the electric field applied to the substrate 150. Apparatus described herein enable smaller distances between the electrode 270 and the substrate 150 as the location and size of the fluid dispense passages 152 does not limit the distance between the two surfaces.

FIG. 4C illustrates the substrate process apparatus 200a, 200b, 300 while in a processing position. The rotation actuator 206 rotates the electrode assembly 201 and the base assembly 205, 305 to a first angle θ1 from a horizontal. The first angle $\theta_1$ is an angle of about 35 degrees to about 90 degrees, such as about 45 degrees to about 90 degrees, such as about 60 degrees to about 90 degrees, such as about 75 degrees to about 90 degrees. In some embodiments, the first angle $\theta_1$ is about 90 degrees from the horizontal.

Rotating the electrode assembly 201 all the way to a vertical orientation at 90 degrees may reduce the stress on the rotation actuator 206 when compared to other angles and dislodges bubbles to reduce the number of bubbles disposed between the substrate 150 and the electrode 270. As the substrate process apparatus 200a, 200b, 300 is rotated, the process volume is filled with process fluid. The rotation occurs after the substrate process apparatus 200a, 200b, 300 is closed to ensure the substrate 150 is secure and the process volume may be filled with process fluid.

Figure 5:
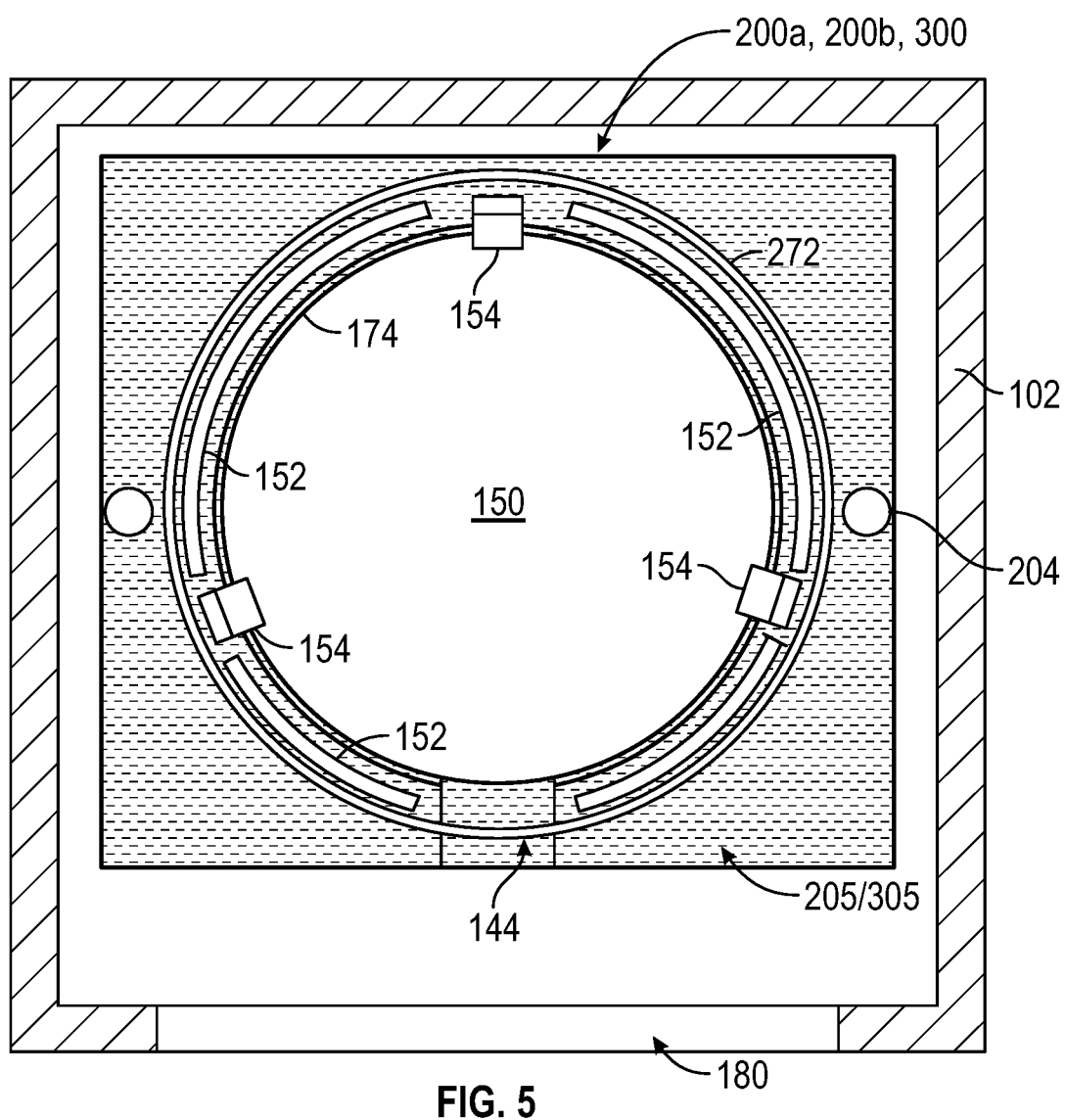
FIG. 5 is a cross-sectional plan view of the immersion field guided post exposure bake chamber according to the embodiment of FIGS. 2A, 2B, and 3 described herein.

FIG. 5 is a cross-sectional plan view of the substrate process apparatus 200a, 200b, 300 of the immersion field guided post exposure bake chamber according to the embodiment of FIGS. 2A, 2B, and 3 described herein. The cross sectional view illustrates the location of the indexer depression 144, the substrate transfer passage 180, the seal groove 272, the one or more clamps 154, and the fluid dispense passages 152.

As shown in FIG. 5, the indexer depression 144 extends to the edge of the base assembly 205/305 and includes a portion of the seal groove 272. In some embodiments, the one or more seal groove 272 is deeper than the indexer depression 144, such that the process volume 216 is sealed during substrate processing. The seal groove 272 is shown herein as a single groove disposed around the base assembly 205/305. The seal groove 272 is disposed outward of the substrate support surface 174, the one or more clamps 154, and the fluid dispense passages 152.

The one or more clamps 154 are disposed to radially overlap a portion of the substrate 150 and the substrate support surface 174. The clamps 154 are disposed evenly about the substrate support surface 174 and between at least some of the fluid dispense passages 152.

The fluid dispense passages 152 are shown as one or more arcuate openings disposed around the substrate support surface. The arcuate openings are used to reduce the velocity at which process fluid enters and leaves the process volume 114. The arcuate openings may include two or more arcuate openings, such as three or more arcuate openings, such as four or more arcuate openings. Each of the arcuate openings are arcs with a common center and the same arc radius. The arc radius is greater than the radius of the substrate support surface 174. Each of the arcs surround about 10 degrees to about 180 degrees of the circumference of the substrate support surface 174. Each of the arcs of the fluid dispense passages 152 are in fluid communication with the reservoir volume 122.

The linear actuators 204 are disposed radially outward of the seal groove 272 and the fluid dispense passages 152. The linear actuators 204 are disposed on opposite sides of the substrate support surface 174 and extend perpendicular to the substrate support surface 174.

Figure 6:
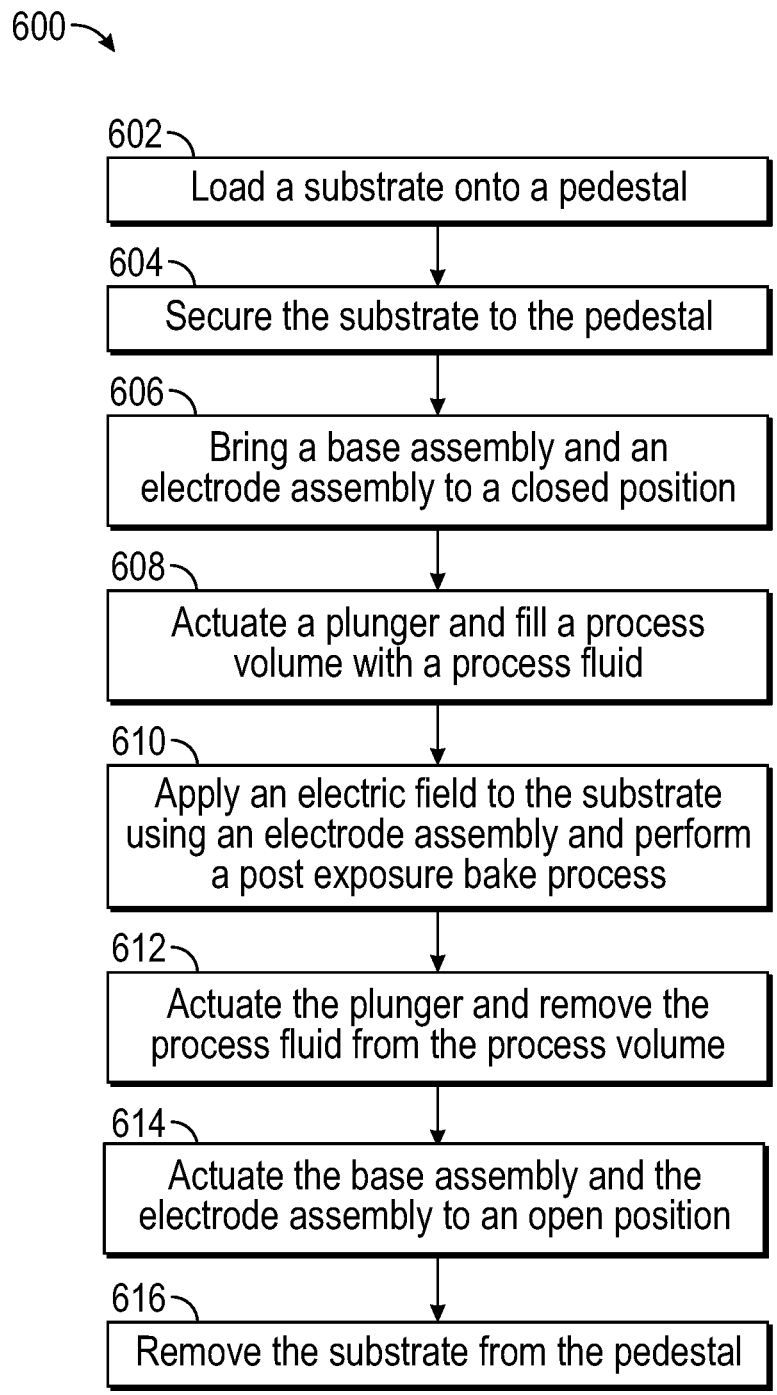
FIG. 6 illustrates operations of a method for performing an immersion post exposure bake process according to an embodiment described herein.

FIG. 6 illustrates operations of a method 600 for performing an immersion post exposure bake process according to an embodiment described herein. The method 600 can be performed using the apparatus of FIGS. 1A-1C, among others. The method 600 includes a first operation 602 of loading a substrate, such as the substrate 150, onto a pedestal, such as the pedestal 106. Loading the substrate onto the pedestal is performed while the electrode assembly 115 and the base assembly 110 are separated and in an open position (e.g., transfer position). The substrate is placed on a substrate support surface 174, for example by a robot. After loading the substrate during the first operation 602, the substrate is secured to the pedestal during a second operation 604. The substrate may be secured by actuating one or more clamps, such as the clamps 154 to secure the substrate. In some embodiments, the substrate is clamped using vacuum chucking or potentially electrostatic chucking. In other embodiments, the substrate is clamped using mechanical clamps. Mechanical clamping can avoid problems associated with process fluid leaking behind the substrate into the vacuum chucking lines. Mechanical clamping also has less impact on the electric field generated later in the method 600.

After the second operation 604, an electrode assembly, such as the electrode assembly 115, and a base assembly, such as the base assembly 110, are moved to a closed position during a third operation 606 to close the substrate process apparatus. Closing the electrode assembly and the base assembly includes forming a seal between the electrode assembly and the base assembly. Forming the seal between the electrode assembly and the base assembly allows for a process fluid to fill a process volume, such as the process volume 114 between the electrode assembly and the base assembly during a fourth operation 608.

During the fourth operation 608, a plunger, such as the plunger 124, is actuated to push a process fluid from a reservoir, such as the reservoir 121 into the process volume to fill the process volume with the process fluid. The process fluid is injected into the process volume and fills the process volume in less than 4 seconds, such as less than 3 seconds, such as less than 2 seconds. To fill the process volume, the process fluid is injected into the process volume at a rate of about 10 L/minute to about 20 L/minute, such as about 13 L/minute to about 18 L/minute, such as about 15 L/minute. In embodiments described herein, the process volume has a volume of about 0.4 L to about 0.6 L, such as about 0.5 L. The process fluid is an intermediate medium, such as a non-gas phase medium, a slurry, a gel, a liquid solution, or a solid state medium that may efficiently maintain voltage levels as applied at a determined range when transmitting from the electrode assembly to the photoresist layer disposed on the substrate.

After the process volume is filled with process fluid during the fourth operation 608, an electric field is applied to the substrate using the electrode assembly and a power exposure bake process is performed during a fifth operation 610. The electric field is distributed between the substrate, such is at a first voltage, and the electrode, which is at a second voltage different from the first voltage. The electric field may be created by applying a voltage differential of up to about 5000 V, such as up to about 3500 V, such as up to about 3000 V. The electric field between the electrode and the substrate is less than about $1\times10^7$ V/m, such as less than $1\times10^6$ V/m, such as less than $1\times10^5$ V/m. The electric field may be about $1\times10^5$ V/m to about $1\times10^7$ V/m, such as about $1\times10^5$ V/m to about $1\times10^6$ V/m. The strength of the electric field is limited by the breakdown voltage of the medium disposed within the process volume. In some embodiments, the breakdown voltage of the fluid disposed within the process volume is about $1.4\times10^7$ V/m. The electric field is applied to the substrate until the post exposure bake operation is complete. During the fifth operation 610, the substrate and the pedestal are heated to a temperature of about 80° C. to about 250° C., such as about 90° C. to about 230° C., such as about 90° C. to about 130° C.

After the post exposure bake process of the fifth operation 610, the plunger is actuated to remove the process fluid from the process volume during a sixth operation 612. Actuating the plunger back to the original position of the plunger creates a vacuum within the reservoir and pulls the process fluid back into the reservoir through the fluid dispense passages. The process fluid may also be removed from the reservoir through one or more fluid conduits and fluid pumps. After removing the process fluid during the sixth operation 612, the base assembly and the electrode assembly are actuated to an open position during a seventh operation 614. Opening the electrode assembly and the base assembly includes breaking the seal between the electrode assembly and the base assembly. After separating the electrode assembly and the base assembly, the process fluid is drained from the process volume between the electrode assembly and the base assembly.

After the seventh operation 614, the substrate is removed from the pedestal during an eighth operation 616. The substrate is removed using an indexer or robot arm and transferred to a different processing module or process station.

Figure 7:
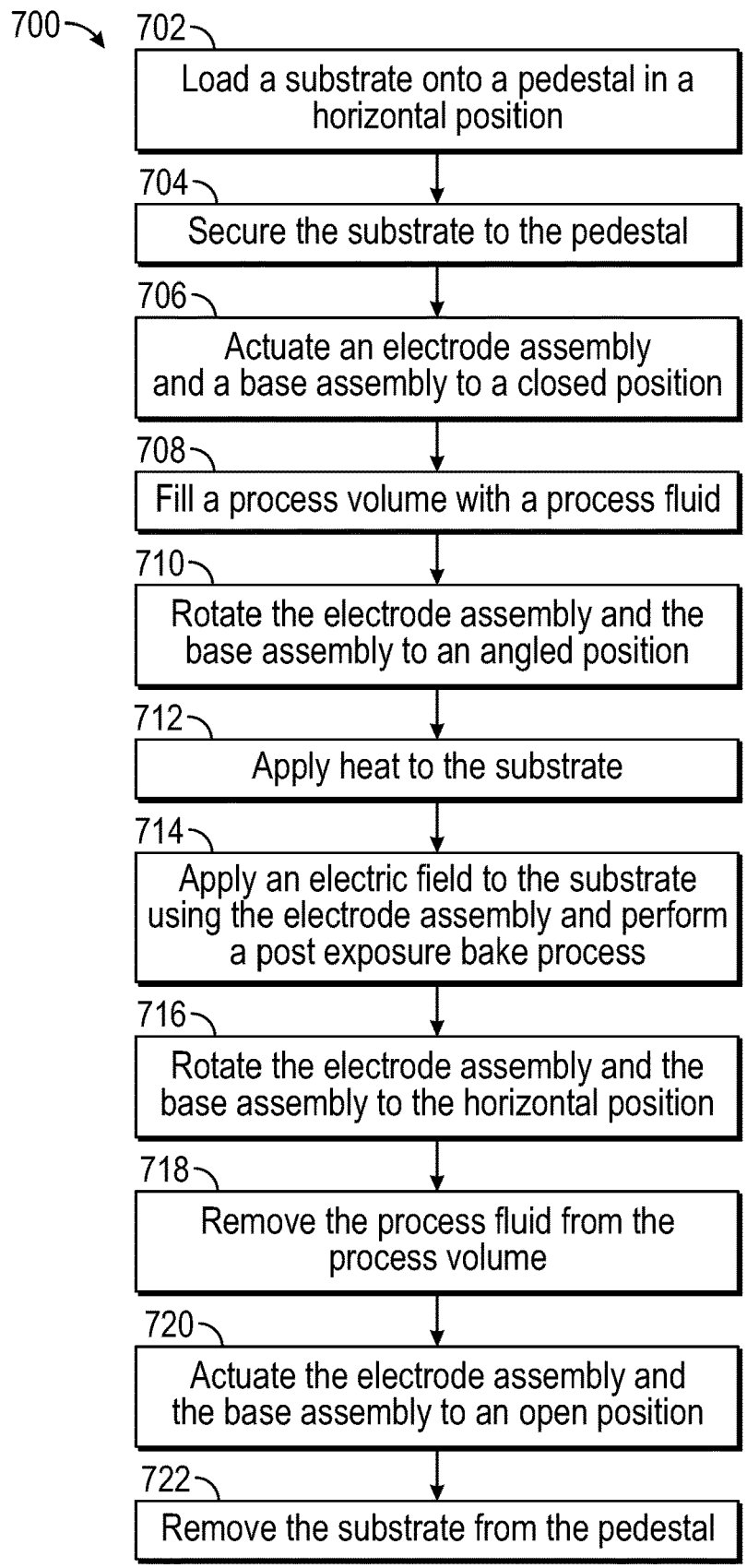
FIG. 7 illustrates operations of a method for performing an immersion post exposure bake process according to another embodiment described herein.

FIG. 7 illustrates operations of a method 700 for performing an immersion post exposure bake process according to another embodiment described herein. The method 700 can be performed using the apparatus of FIGS. 2A, 2B, and 3, among others. The method 700 includes a first operation 702 of loading a substrate, such as the substrate 150, onto a pedestal, such as the pedestal 214, 302. Loading the substrate onto the pedestal is performed while an electrode assembly, such as the electrode assembly 201, and a base assembly, such as the base assembly 205, 305, are separated and in an open position. The substrate is placed on a substrate support surface 174. During loading of the substrate onto the pedestal, the electrode assembly and the base assembly are disposed on a horizontal position. The electrode assembly and the base assembly being in a horizontal position enables the substrate to be loaded into the base assembly while the substrate is horizontally oriented.

After loading the substrate during the first operation 702, the substrate is secured to the pedestal during a second operation 404. The substrate is secured by actuating one or more clamps, such as the clamps 154 to secure the substrate. In some embodiments, the substrate is clamped using vacuum chucking or potentially electrostatic chucking. Mechanical clamping is generally utilized to avoid difficulties with process fluid leaking behind the substrate into the vacuum chucking lines. Mechanical clamping also has less impact on the electric field generated later in the method 700.

After the second operation 704, the electrode assembly and the base assembly are moved to a closed position during a third operation 706 to close the substrate process apparatus. Closing the electrode assembly and the base assembly includes forming a seal between the electrode assembly and the base assembly. Forming the seal between the electrode assembly and the base assembly allows for a process fluid to fill a process volume, such as the process volume 216 between the electrode assembly and the base assembly during a fourth operation 708. During the fourth operation 708, the process fluid is dispensed into the process volume using any of the apparatus of FIG. 2A, 2B, or C. Therefore, the process fluid enters the process volume through fluid dispense passages, such as the fluid dispense passage 152, from either a reservoir, such as the reservoir 121, or a fluid distribution conduit 304. The process volume is filled with the process fluid. The process fluid is injected into the process volume and fills the process volume in less than 4 seconds, such as less than 3 seconds, such as less than 2 seconds. To fill the process volume, the process fluid is injected into the process volume at a rate of about 5 L/minute to about 20 L/minute, such as about 10 L/minute to about 15 L/minute. In embodiments described herein, the process volume has a volume of about 0.4 L to about 0.6 L, such as about 0.5 L. The process fluid is an intermediate medium, such as a non-gas phase medium, a slurry, a gel, a liquid solution, or a solid state medium that may efficiently maintain voltage levels as applied at a determined range when transmitting from the electrode assembly to the photoresist layer disposed on the substrate.

Either simultaneously with or subsequent to the fourth operation 708, the electrode assembly and the base assembly are rotated to an angled position during a fifth operation 710. The electrode assembly and the base assembly are rotated using a rotation actuator, such as the rotation actuator 206. The base assembly and the electrode assembly are actuated to a first angle $\theta_1$ from the horizontal. The first angle $\theta_1$ is an angle of about 15 degrees to about 90 degrees, such as about 35 degrees to about 90 degrees, such as about 40 degrees to about 90 degrees, such as about 75 degrees to about 90 degrees. In some embodiments, the first angle $\theta_1$ is greater than or about 15 degrees from the horizontal, such as greater than or about 30 degrees from the horizontal, such as about 90 degrees from the horizontal.

Actuating the base assembly and the electrode assembly all the way to a vertical orientation at 90 degrees reduces the stress on the rotation actuator when compared to other angles and dislodges bubbles to reduce the number of bubbles disposed between the substrate and the electrode. As the electrode assembly and the base assembly are rotated, the process volume may be filled with process fluid. However, smaller rotation angles of the base assembly and the electrode assembly reduce the height of the assembly and may enable stacking of the substrate process apparatus.

After the electrode assembly and the base assembly are actuated to the first angle $\theta_1$ during the fifth operation 710, heat is applied to the substrate during a sixth operation 712. Applying the heat to the substrate includes heating the substrate to about 80° C. to about 250° C., such as about 90° C. to about 230° C., such as about 90° C. to about 130° C. The heat is applied using one or more heating elements, such as the one or more heating elements 148.

After the sixth operation 712, an electric field is applied to the substrate using the electrode assembly and a power exposure bake process is performed during a seventh operation 714. The electric field is distributed between the substrate, such is at a first voltage, and the electrode, which is at a second voltage different from the first voltage. The electric field may be created by applying a voltage differential of up to about 5000 V, such as up to about 3500 V, such as up to about 3000 V. The electric field between the electrode and the substrate is less than about $1 \times 10^7$ V/m, such as less than $1 \times 10^6$ V/m, such as less than $1 \times 10^5$ V/m. The electric field may be about $1 \times 10^5$ V/m to about $1 \times 10^7$ V/m, such as about $1 \times 10^5$ V/m to about $1 \times 10^6$ V/m. The strength of the electric field is limited by the breakdown voltage of the medium disposed within the process volume. In some embodiments, the breakdown voltage of the fluid disposed within the process volume is about $1.4 \times 10^7$ V/m. The electric field is applied to the substrate until the post exposure bake operation is complete. Heating is halted when the post exposure bake operation is completed.

After the seventh operation 714, the electrode assembly and the base assembly are rotated back to the horizontal position from the first angle $\theta_1$ during an eighth operation 716. After rotating the electrode assembly and the base assembly back to the horizontal position, the process fluid is removed from the process volume during a ninth operation 718. The removal of the process fluid is performed by drawing the process fluid back through the fluid dispense passages 152. Alternatively, the removal of the process fluid is performed using another fluid conduit and fluid pump or the process fluid is removed as the electrode assembly and the base assembly are opened during a tenth operation 720.

The tenth operation 720 is performed either simultaneously with or after the ninth operation 718. The tenth operation 720 includes actuating the electrode assembly and the base assembly back an open position. Actuating the electrode assembly and the base assembly to the open position involves separating the sealing surfaces of the electrode assembly and the base assembly and actuating apart the electrode assembly and the base assembly.

After the tenth operation 720, the substrate is removed from the pedestal during an eleventh operation 722. The substrate is removed using an indexer or robot arm and transferred to a different processing module or process station.

Embodiments described herein are beneficial in that substrates may be inserted into the process station apparatus while in a horizontal position. The process stations herein also reduce bubbling effects on the post exposure bake process and allow for the electrodes and substrate to be disposed closer together during processing, which reduces the impact of electric field non-uniformities. Dispensing fluid into the process volume from a dispense passage disposed around the substrate reduces the velocity of process fluid as it enters the process volume and allows for even distribution of the process fluid.

While the foregoing is directed to embodiments of the present disclosure, other and further embodiments of the disclosure may be devised without departing from the basic scope thereof, and the scope thereof is determined by the claims that follow.

What is claimed is:

1. A substrate process apparatus, comprising:
a base assembly comprising:
a pedestal;
a substrate support with a substrate support surface;
a reservoir forming a reservoir volume;
a piston assembly at least partially disposed within the reservoir volume; and
a fluid passage disposed between a process volume and the reservoir; and
an electrode assembly comprising:
a permeable electrode; and
a hood disposed around a portion of the permeable electrode.

2. The substrate process apparatus of claim 1, wherein the permeable electrode is an electrode mesh disposed parallel to the substrate support surface.

3. The substrate process apparatus of claim 1, wherein the fluid passage is one or more arcuate openings disposed around the substrate support surface and in fluid communication with the reservoir.

4. The substrate process apparatus of claim 1, wherein the piston assembly is coupled to an actuator configured to raise and lower the piston assembly within the reservoir.

5. The substrate process apparatus of claim 1, wherein the electrode assembly further comprises
a monitor electrode disposed above the permeable electrode; and
a ceramic spacer disposed between the monitor electrode and the permeable electrode.

6. The substrate process apparatus of claim 1, further comprising one or more clamps within the process volume and disposed outward of the substrate support surface.

7. The substrate process apparatus of claim 1, wherein the base assembly is fabricated from a highly conductive material having an electrical resistivity of less than about $1 \times 10^{-3}$ $\Omega \cdot m$.

8. The substrate process apparatus of claim 1, wherein the hood has an electrical resistivity of less than about $1 \times 10^{-3}$ $\Omega \cdot m$.

9. A substrate process apparatus, comprising:
a base assembly comprising:
a pedestal;
a substrate support with a substrate support surface disposed thereon;
a reservoir forming a reservoir volume; and
a fluid passage disposed between a process volume and the reservoir;
an electrode assembly comprising:
an electrode; and
an electrode housing coupled to the electrode;
two or more linear actuators coupling the base assembly and the electrode assembly and configured to move the base assembly and the electrode assembly between an open and a closed position; and
a rotation actuator coupled to one of the base assembly or the electrode assembly and configured to rotate the base assembly and the electrode assembly about an axis.

10. The substrate process apparatus of claim 9, wherein the two or more linear actuators are pneumatic cylinders.

11. The substrate process apparatus of claim 9, wherein the rotation actuator is coupled to the electrode housing.

12. The substrate process apparatus of claim 9, wherein the base assembly further comprises:
a base sealing surface disposed around the substrate support; and
the electrode assembly further comprises a housing sealing surface disposed parallel to the base sealing surface and disposed around the electrode.

13. The substrate process apparatus of claim 9, wherein the fluid passage comprises one or more arcuate openings disposed around the substrate support and in fluid communication with the reservoir.

14. The substrate process apparatus of claim 9, wherein the base assembly further comprises:
a fluid inlet fluidly coupled to the reservoir volume; and
a fluid outlet fluidly coupled to the reservoir volume.

15. The substrate process apparatus of claim 9, further comprising a piston assembly at least partially disposed within the reservoir volume.

16. A substrate process apparatus, comprising:
a base assembly comprising:
a pedestal;
a substrate support surface of the pedestal; and
one or more fluid passages disposed through the base assembly;
an electrode assembly comprising:
an electrode; and
an electrode housing coupled to the electrode;
two or more linear actuators coupling the base assembly and the electrode assembly and configured to move the base assembly and the electrode assembly between an open and a closed position; and
a rotation actuator coupled to one of the base assembly or the electrode assembly and configured to rotate the base assembly and the electrode assembly about an axis.

17. The substrate process apparatus of claim 16, wherein the one or more fluid passages comprise one or more arcuate openings disposed around the substrate support surface and in fluid communication with a fluid supply.

18. The substrate process apparatus of claim 16, wherein the base assembly further comprises:
a base sealing surface disposed around the substrate support surface; and
the electrode assembly further comprises a housing sealing surface disposed parallel to the base sealing surface and disposed around the electrode.

19. The substrate process apparatus of claim 16, wherein the base assembly further comprises one or more heating elements.

20. The substrate process apparatus of claim 16, wherein the rotation actuator is configured to rotate the base assembly and the electrode assembly about an axis disposed through a center of mass of the substrate process apparatus.

* * * * *